(12) United States Patent
Kim et al.

(10) Patent No.: US 12,171,097 B2
(45) Date of Patent: Dec. 17, 2024

(54) SEMICONDUCTOR DEVICES AND ELECTRONIC SYSTEMS INCLUDING THE SAME

(71) Applicant: Samsung Electronics Co., Ltd., Suwon-si (KR)

(72) Inventors: Kangmin Kim, Hwaseong-si (KR); Kyeong Jin Park, Yongin-si (KR); Seulji Lee, Seoul (KR); Hyejin Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 559 days.

(21) Appl. No.: 17/370,507

(22) Filed: Jul. 8, 2021

(65) Prior Publication Data
US 2022/0139952 A1 May 5, 2022

(30) Foreign Application Priority Data

Oct. 30, 2020 (KR) ........................ 10-2020-0143304

(51) Int. Cl.
| | |
|---|---|
| *H10B 43/27* | (2023.01) |
| *G11C 7/18* | (2006.01) |
| *H01L 23/522* | (2006.01) |
| *H10B 41/10* | (2023.01) |
| *H10B 41/27* | (2023.01) |

(Continued)

(52) U.S. Cl.
CPC ............... *H10B 43/27* (2023.02); *G11C 7/18* (2013.01); *H01L 23/5226* (2013.01); *H10B 41/10* (2023.02); *H10B 41/27* (2023.02); *H10B 41/35* (2023.02); *H10B 41/41* (2023.02); *H10B 43/10* (2023.02); *H10B 43/35* (2023.02); *H10B 43/40* (2023.02)

(58) Field of Classification Search
CPC .............. H10B 20/40–65; H10B 53/20; H10B 41/20–27; H10B 43/20–27; H10B 51/20; H10B 63/84–845; H01L 2224/05009; H01L 2224/05025; H01L 2224/05087; H01L 2224/0509; H01L 2224/0557; H01L 2224/08146
See application file for complete search history.

(56) References Cited

U.S. PATENT DOCUMENTS

| | | |
|---|---|---|
| 9,324,730 B2 | 4/2016 | Nam et al. |
| 9,530,789 B2 | 12/2016 | Lee et al. |

(Continued)

FOREIGN PATENT DOCUMENTS

KR 1020210120400 A 10/2021

*Primary Examiner* — Amar Movva
(74) *Attorney, Agent, or Firm* — Myers Bigel, P.A.

(57) ABSTRACT

A semiconductor device is disclosed. The semiconductor device may include gate stacks that are on a substrate, are spaced apart from each other in a first direction, and include electrodes and cell insulating layers alternately stacked, a separation structure between the gate stacks and extending in a second direction crossing the first direction, vertical structures penetrating the gate stacks and having conductive pads on upper portions thereof, a supporting structure on the gate stacks, bit lines on the supporting structure, and contact plugs penetrating the supporting structure and electrically connecting the bit lines to the vertical structures. A bottom surface of a portion of the supporting structure on the separation structure may be lower than top surfaces of the conductive pads.

20 Claims, 22 Drawing Sheets

(51) Int. Cl.
  *H10B 41/35*  (2023.01)
  *H10B 41/41*  (2023.01)
  *H10B 43/10*  (2023.01)
  *H10B 43/35*  (2023.01)
  *H10B 43/40*  (2023.01)

(56) References Cited

U.S. PATENT DOCUMENTS

| | | |
|---|---|---|
| 9,755,085 B2 | 9/2017 | Lee et al. |
| 10,312,191 B2 | 6/2019 | Jung et al. |
| 2013/0020707 A1* | 1/2013 | Or-Bach ............... H01L 29/792 |
| | | 257/E23.011 |
| 2019/0067320 A1* | 2/2019 | Cho ....................... H01L 23/528 |
| 2020/0091164 A1* | 3/2020 | Liu ........................ H10B 41/35 |
| 2021/0305150 A1 | 9/2021 | Kim et al. |

* cited by examiner

SEMICONDUCTOR DEVICES AND ELECTRONIC SYSTEMS INCLUDING THE SAME

CROSS-REFERENCE TO RELATED APPLICATION(S)

This U.S. non-provisional patent application claims priority under 35 U.S.C. § 119 to Korean Patent Application No. 10-2020-0143304, filed on Oct. 30, 2020, in the Korean Intellectual Property Office, the entire contents of which are hereby incorporated by reference.

BACKGROUND

The present disclosure relates to semiconductor devices. A semiconductor device capable of storing a large amount of data may be demanded as a part of an electronic system. Accordingly, many studies are being conducted to increase the data storage capacity of semiconductor devices. For example, semiconductor devices in which memory cells are three-dimensionally arranged are being suggested.

SUMMARY

An embodiment of the inventive concept provides a semiconductor device with an increased reliability and an increased integration density.

An embodiment of the inventive concept provides an electronic system including the semiconductor device.

According to an embodiment of the inventive concept, a semiconductor device may include gate stacks on a substrate and spaced apart from each other in a first direction, the gate stacks including electrodes and cell insulating layers that are alternately stacked, a separation structure between the gate stacks and extending in a second direction crossing the first direction, vertical structures penetrating the gate stacks and having conductive pads on upper portions thereof, a supporting structure on the gate stacks, bit lines on the supporting structure, and contact plugs penetrating the supporting structure and electrically connecting the bit lines to the vertical structures. A bottom surface of a portion of the supporting structure on the separation structure may be lower than top surfaces of the conductive pads.

According to an embodiment of the inventive concept, a semiconductor device may include a peripheral circuit structure and a cell array structure on the peripheral circuit structure. The cell array structure may include a lower semiconductor layer and a source semiconductor layer on the lower semiconductor layer, gate stacks on the source semiconductor layer and spaced apart from each other in a first direction, the gate stacks including electrodes and cell insulating layers, alternately stacked, a separation structure between the gate stacks and extending in a second direction crossing the first direction, vertical structures that penetrate the gate stacks and are electrically connected to the source semiconductor layer, the vertical structures having conductive pads on upper portions thereof, an interface insulating layer between the vertical structures and the electrodes, a supporting structure on the gate stacks, bit lines on the supporting structure, and contact plugs penetrating the supporting structure and electrically connecting the bit lines to the vertical structures. The supporting structure may include a plurality of openings along the separation structure. The separation structure may include first portions that extend into the openings, and second portions that are between the openings. A top surface of a portion of the interface insulating layer that extends into a region between the second portions of the separation structure and the supporting structure may be lower than top surfaces of the conductive pads.

According to an embodiment of the inventive concept, an electronic system may include a main substrate, a semiconductor device on the main substrate, and a controller on the main substrate and electrically connected to the semiconductor device. The semiconductor device may include gate stacks that are spaced apart from each other in a first direction and include electrodes and cell insulating layers alternately stacked, a separation structure between the gate stacks and extending in a second direction crossing the first direction, vertical structures penetrating the gate stacks and having conductive pads on upper portions thereof, a supporting structure on the gate stacks, bit lines on the supporting structure, contact plugs penetrating the supporting structure and electrically connecting the bit lines to the vertical structures, a peripheral circuit electrically connected to the bit lines, and an input/output pad electrically connected to the peripheral circuit. A bottom surface of a portion of the supporting structure on the separation structure may be lower than top surfaces of the conductive pads.

According to an embodiment of the inventive concept, a method of fabricating a semiconductor device may include forming a mold structure, in which sacrificial layers and insulating layers are alternately stacked, on a substrate, forming trenches to penetrate the mold structure, forming first sacrificial patterns in the trenches, forming a first supporting layer on the mold structure and the first sacrificial patterns, forming vertical structures to penetrate the first supporting layer and the mold structure, forming a second supporting layer on the first supporting layer on the vertical structures, forming openings to penetrate the first and second supporting layers and to expose the first sacrificial patterns, removing the first sacrificial patterns through the openings, and replacing the sacrificial layers with electrodes.

DETAILED DESCRIPTION

Figure 1:
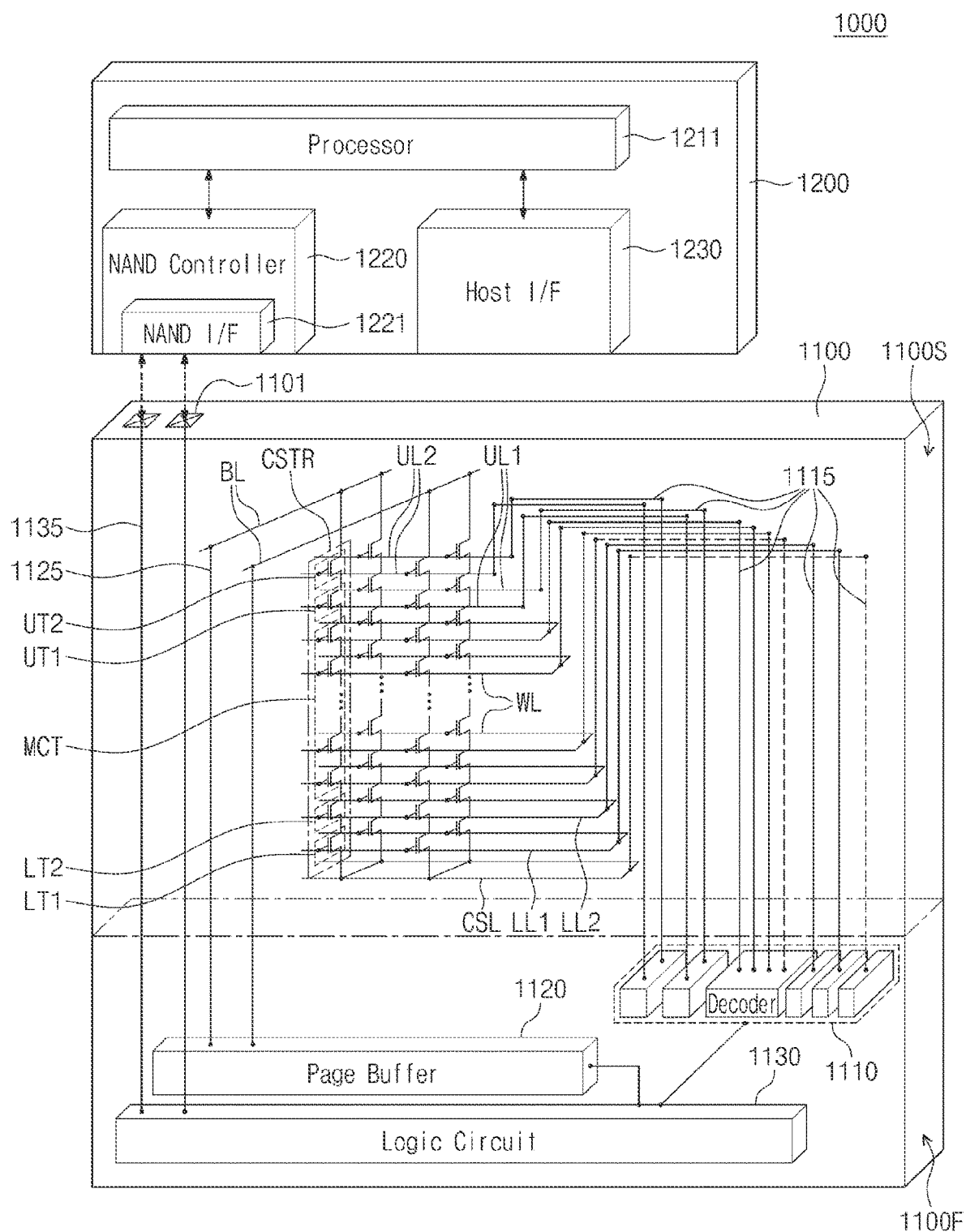
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. As an example, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, at least one of the upper transistors UT1 and UT2 may include the string selection transistor, and at least one of the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from a region in the first structure 1100F to a region in the second structure 1100S. The bit lines BL may be electrically connected to the page buffer 1120 through second connection lines 1125, which are extended from a region in the first structure 1100F to a region in the second structure 1100S.

In the first structure 1100F, the decoder circuit 1110 and the page buffer 1120 may be configured to control an operation, which is performed on at least one of the memory cell transistors MCT by a selection memory cell transistor. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and is extended into the second structure 1100S.

The controller 1200 may include a processor 1211, a NAND controller 1220, and a host interface (I/F) 1230. In an embodiment, the electronic system 1000 may include a plurality of semiconductor devices 1100, and in this case, the controller 1200 may control the semiconductor devices 1100.

The processor 1211 may control overall operations the electronic system 1000 including the controller 1200. The processor 1211 may be operated depending on a specific firmware and may control the NAND controller 1220 to access the semiconductor device 1100. The NAND controller 1220 may include a NAND interface (I/F) 1221 which is used for communication with the semiconductor device 1100. The NAND interface 1221 may be used to transmit and receive control commands, which are used to control the semiconductor device 1100, data, which will be written in or read from the memory cell transistors MCT of the semiconductor device 1100, and so forth. The host interface 1230 may be configured to allow for communication between the electronic system 1000 and an external host. When a control command is received from the external host through the host interface 1230, the processor 1211 may control the semiconductor device 1100 in response to the control command.

Figure 2:
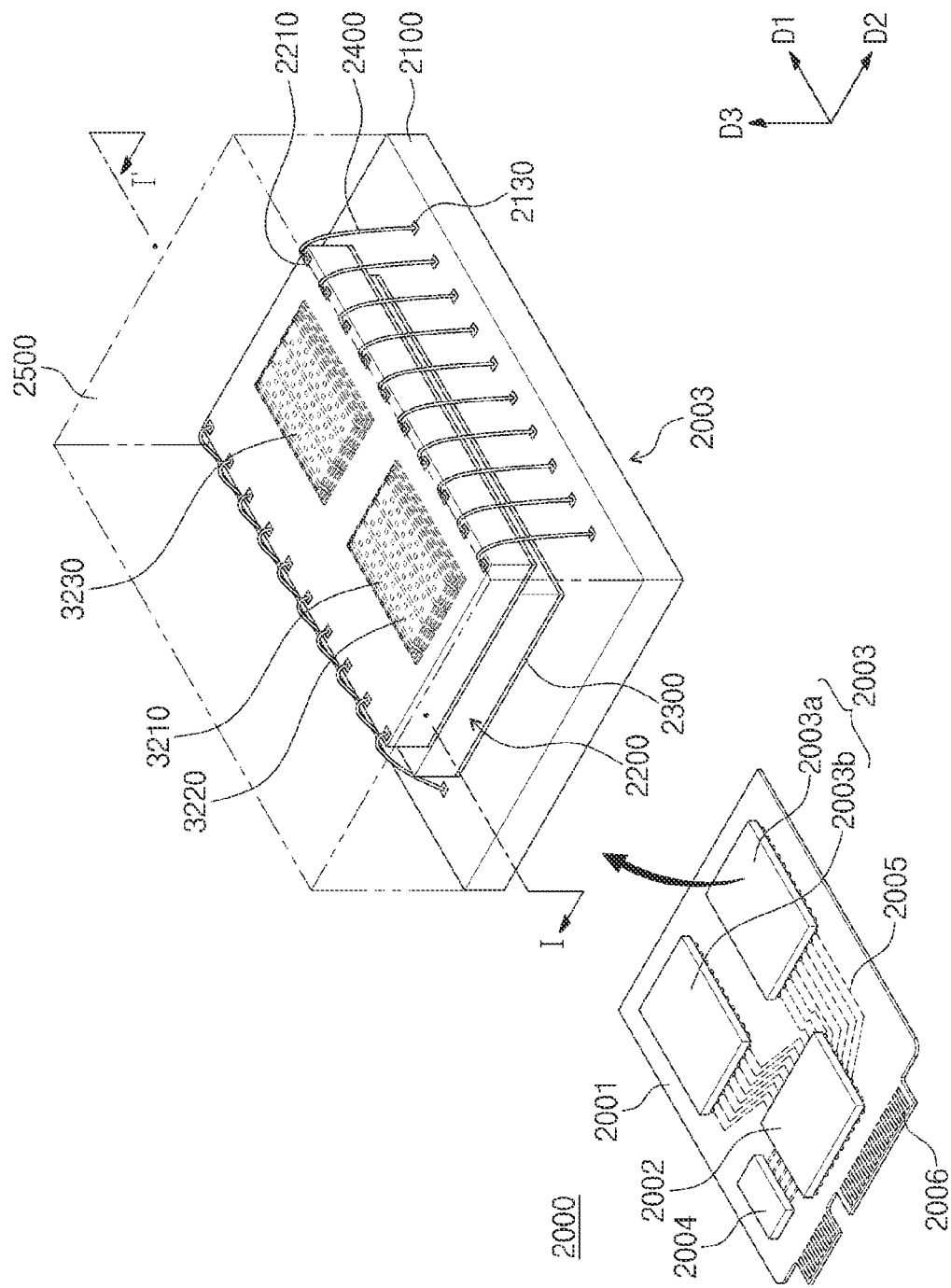
FIG. 2 is a perspective view schematically illustrating an electronic system including a semiconductor device, according to an embodiment of the inventive concept.

FIG. 2 is a perspective view schematically illustrating an electronic system including a semiconductor device, according to an embodiment of the inventive concept.

Referring to FIG. 2, an electronic system 2000 according to an embodiment of the inventive concept may include a main substrate 2001 and a controller 2002, at least one semiconductor package 2003, and a dynamic random-access memory (DRAM) 2004, which are mounted on the main substrate 2001. The semiconductor package 2003 and the DRAM 2004 may be connected to the controller 2002 through interconnection patterns 2005, which are formed on or in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by electric power that is supplied from the external host through the connector 2006. The electronic system 2000 may further include a power management integrated circuit (PMIC) that is configured to separately supply electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 on (e.g., to cover) the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an embodiment of the inventive concept.

In an embodiment, the connection structure 2400 may be a bonding wire electrically connecting the input/output pad 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared independently of the main substrate 2001, and may be connected to each other through interconnection lines, which are provided in the interposer substrate.

Figure 3:
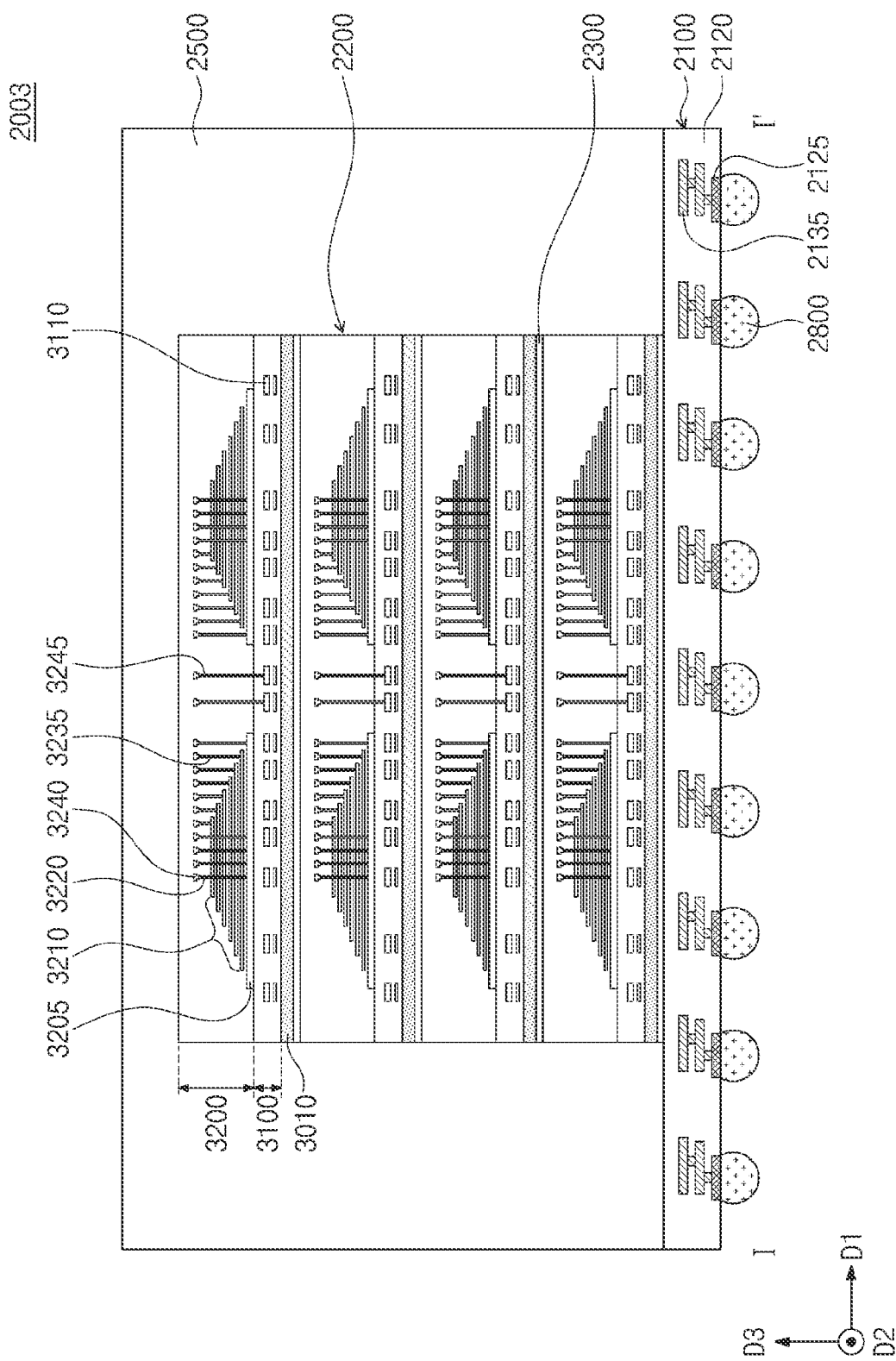
FIGS. 3 and 4 are sectional views, each of which schematically illustrates a semiconductor package according to an embodiment of the inventive concept.
Figure 4:
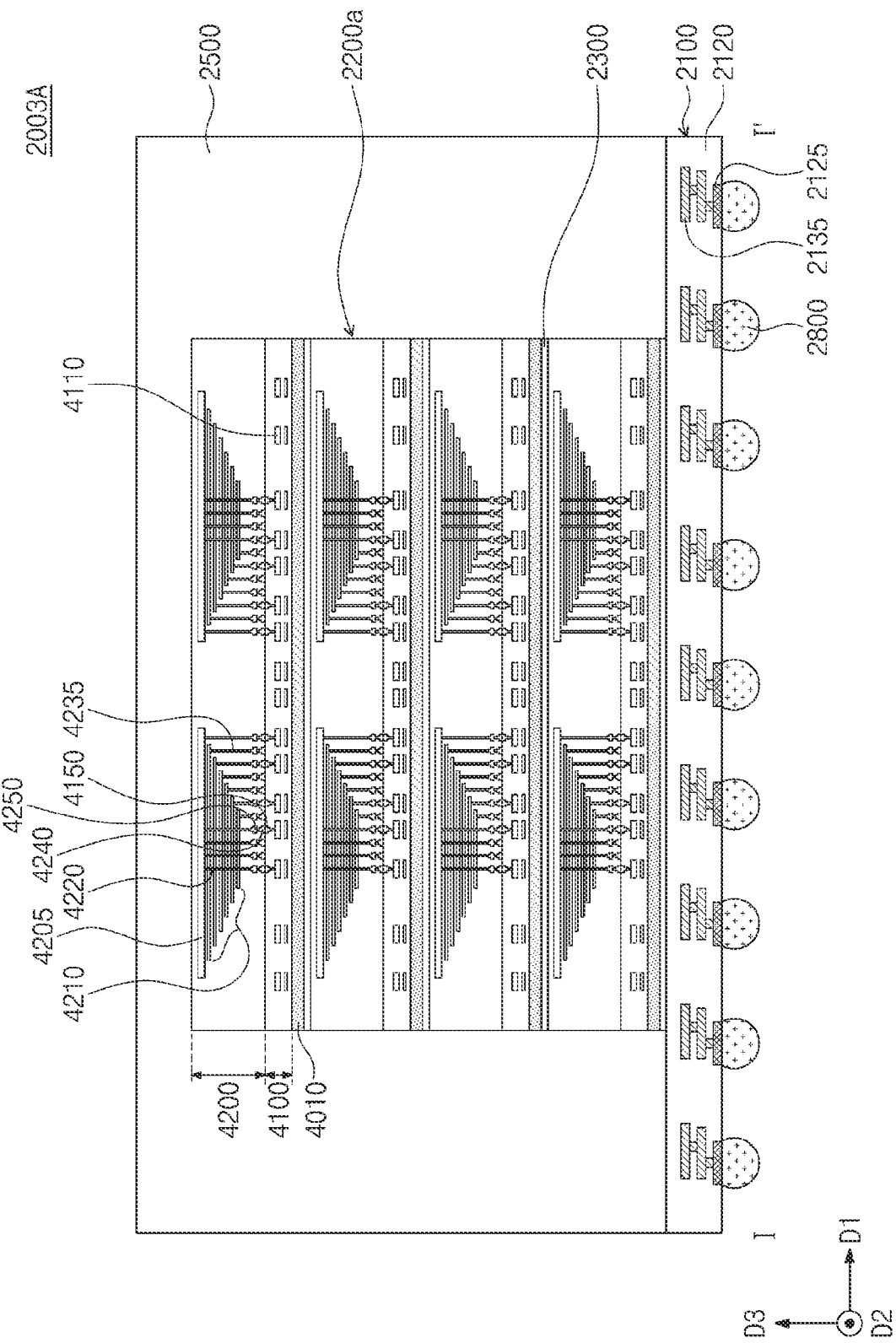

FIGS. 3 and 4 are sectional views, each of which schematically illustrates a semiconductor package according to an embodiment of the inventive concept. FIGS. 3 and 4 conceptually illustrate two different examples of the semiconductor package of FIG. 2 and are, for example, sectional views taken along a line I-I' of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2) disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The lower pads 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 penetrating the stack 3210, bit lines 3240 electrically connected to the vertical structures 3220, and cell contact plugs 3235 electrically connected to the word lines WL (e.g., see FIG. 1) of the stack 3210. The second structure 3200 may further include separation structures 3230 (e.g., see FIG. 2), which will be described in more detail below with respect to separation structures SS (e.g., see FIG. 5).

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210 or may be disposed to penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 penetrating the stack 4210, and second junction structures 4240 electrically connected to the vertical structures 4220 and the word lines WL (e.g., see FIG. 1) of the stack 4210. For example, the second junction structures 4240 may be electrically connected to the vertical structures 4220 and the word lines WL (e.g., see FIG. 1) respectively through bit lines 4250, which are electrically connected to the vertical structures 4220, and cell contact plugs 4235, which are electrically connected to the word lines WL (e.g., see FIG. 1). The first junction structures 4150 of the first structure 4100 and the second junction structures 4240 of the second structure 4200 may be in contact with each other and may be bonded to each other. Portions of the first and second junction structures 4150 and 4240, which are bonded to each other, may be formed of, for example, copper (Cu). Each of the semiconductor chips 2200a may further include the input/output pads 2210 (e.g., see FIG. 2), which are electrically connected to the peripheral lines 4110 of the first structure 4100.

The semiconductor chips 2200 of FIG. 3 and the semiconductor chips 2200a of FIG. 4 may be connected to each other by the connection structures 2400 (e.g., see FIG. 2), which are provided in the form of bonding wires. However, in an embodiment, semiconductor chips, which are provided in the same semiconductor package, may be electrically connected to each other by a connection structure including through silicon vias (TSVs).

The first structure 3100 of FIG. 3 and the first structure 4100 of FIG. 4 may correspond to a peripheral circuit structure in an embodiment to be described below, and the second structure 3200 of FIG. 3 and the second structure 4200 of FIG. 4 may correspond to a cell array structure in an embodiment to be described below.

Figure 5:
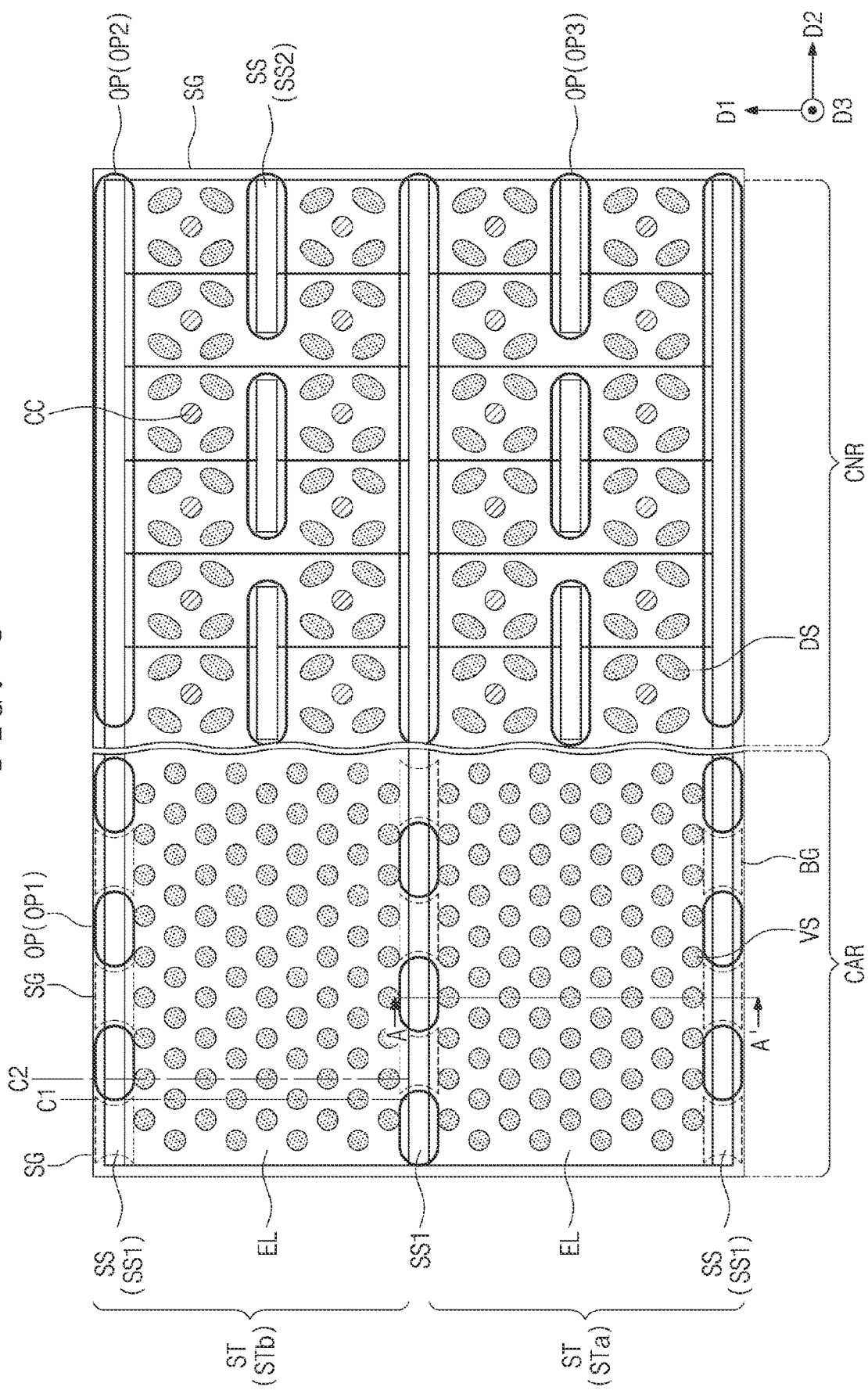
FIG. 5 is a plan view illustrating a semiconductor device according to an embodiment of the inventive concept.
Figure 6:
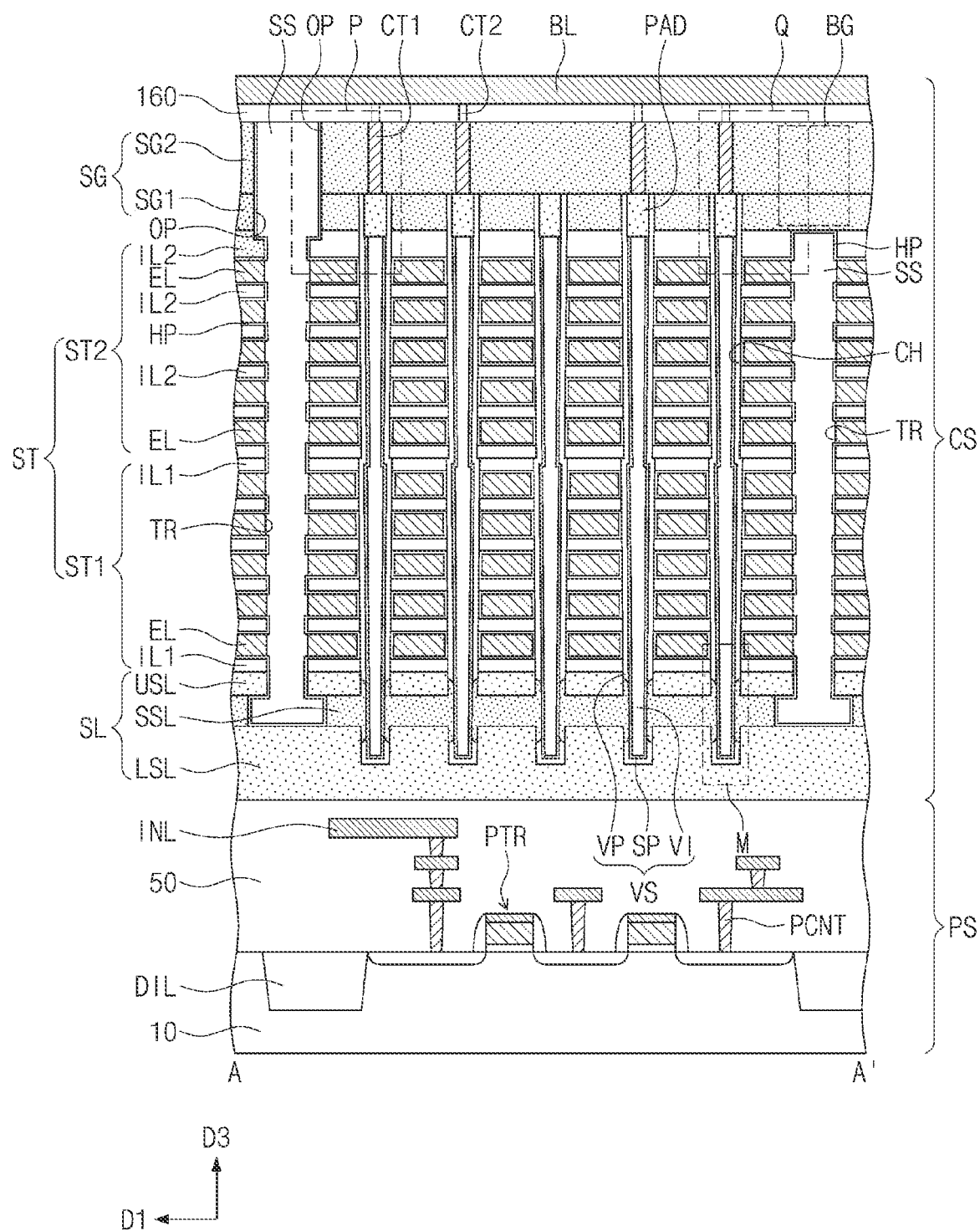
FIG. 6 is a sectional view taken along a line A-A' of FIG. 5.
Figure 7:
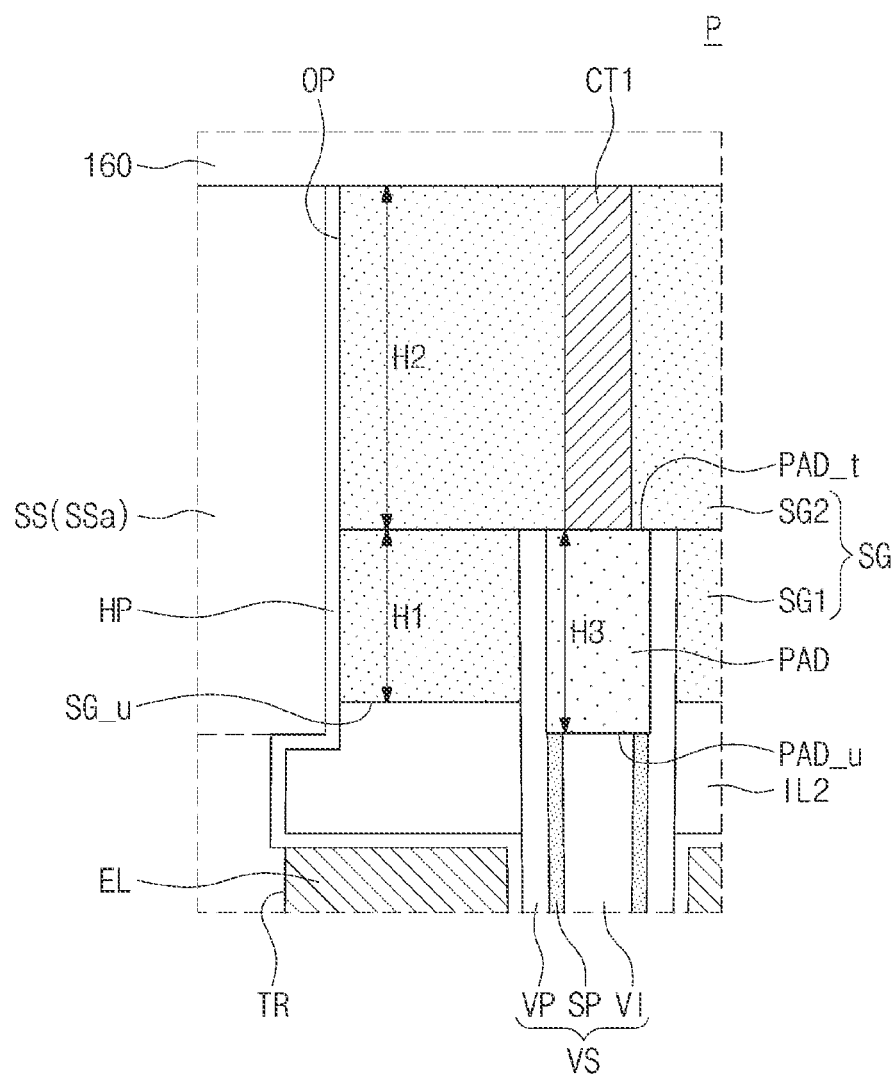
FIG. 7 is an enlarged view of a portion P of FIG. 6.
Figure 8:
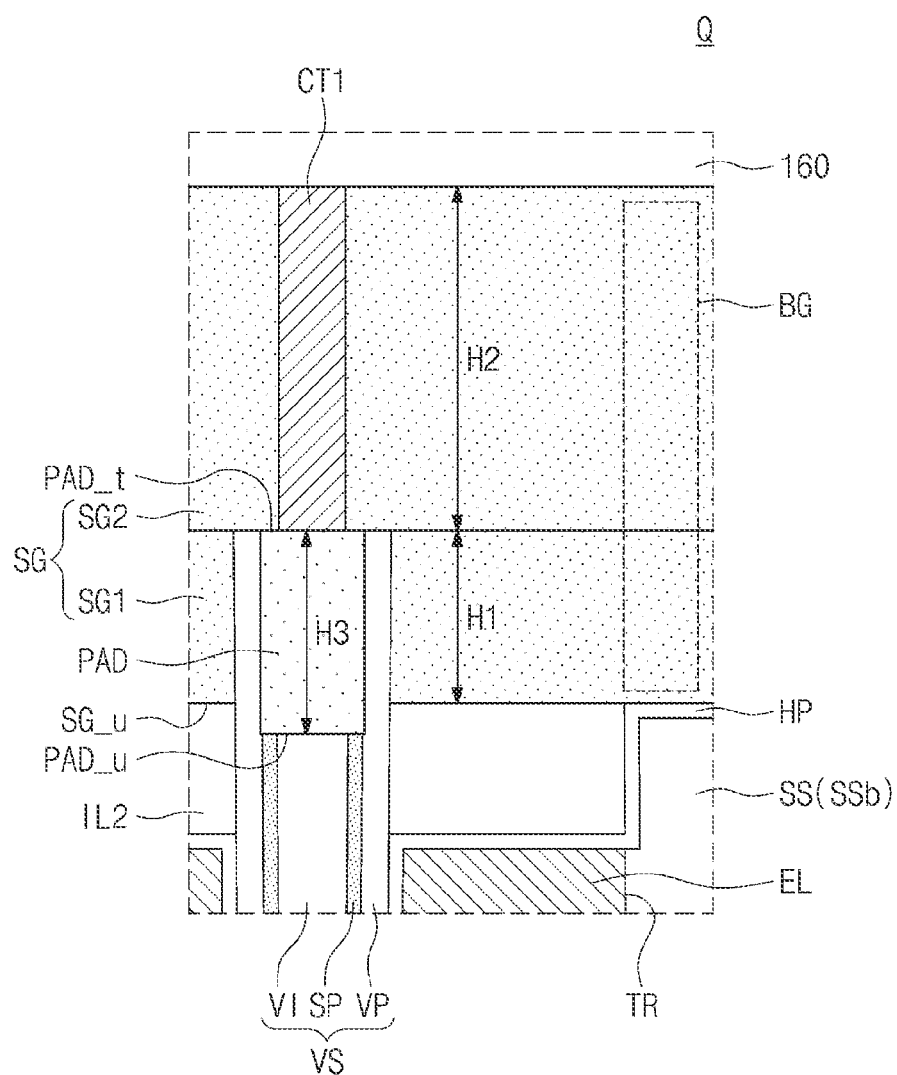
FIG. 8 is an enlarged view of a portion Q of FIG. 6.
Figure 9:
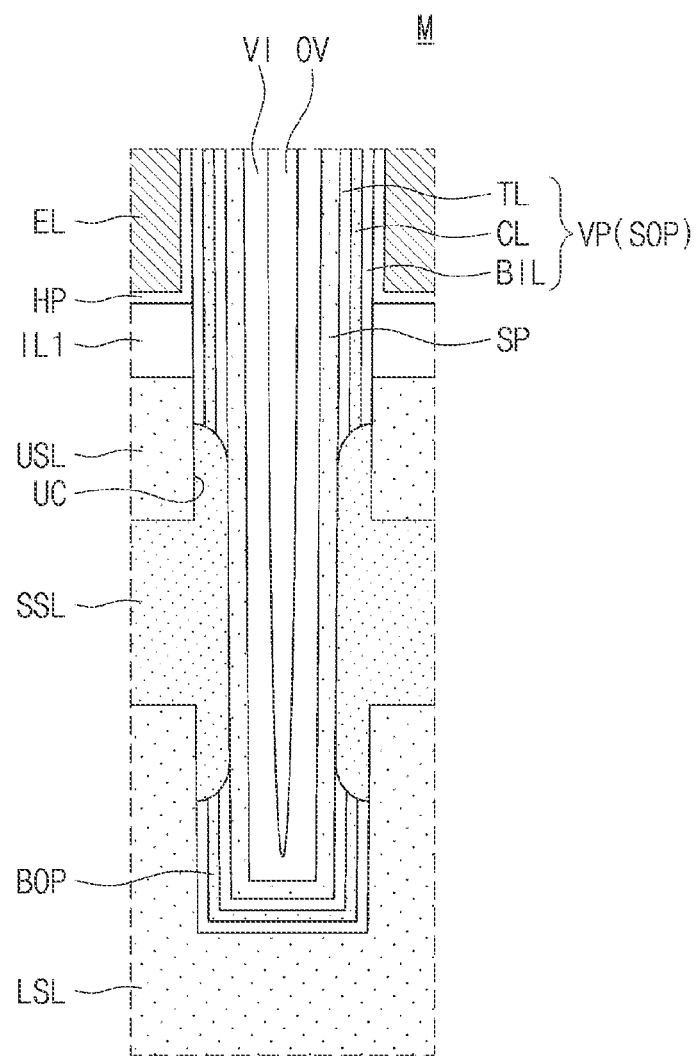
FIG. 9 is an enlarged view of a portion M of FIG. 6.

FIG. 5 is a plan view illustrating a semiconductor device according to an embodiment of the inventive concept. FIG. 6 is a sectional view taken along a line A-A' of FIG. 5. FIG. 7 is an enlarged view of a portion P of FIG. 6. FIG. 8 is an enlarged view of a portion Q of FIG. 6. FIG. 9 is an enlarged view of a portion M of FIG. 6. The structure of FIG. 5 may be a portion of the semiconductor device described with reference to FIGS. 1 to 4.

Referring to FIGS. 5 to 9, a peripheral circuit structure PS including peripheral transistors PTR may be disposed on a first substrate 10. A cell array structure CS including gate stacks ST may be disposed on the peripheral circuit structure PS. The first substrate 10 may be a silicon substrate, a silicon-germanium substrate, a germanium substrate, or a single-crystalline epitaxial layer grown on a single-crystalline silicon substrate. The first substrate 10 may include active regions, which are defined by a device isolation layer DIL. The peripheral transistors PTR may constitute a decoder circuit, a page buffer, a logic circuit, or the like, as described above.

The peripheral circuit structure PS may include lower interconnection lines INL provided on the peripheral transistors PTR and a first interlayer insulating layer 50 on (e.g., covering) the peripheral transistors PTR and the lower interconnection lines INL. A peripheral contact PCNT may be provided between the lower interconnection line INL and the peripheral transistor PTR to electrically connect them to each other. The first interlayer insulating layer 50 may include a plurality of insulating layers, which are stacked on the first substrate 10. For example, the first interlayer insulating layer 50 may include a silicon oxide layer, a silicon nitride layer, a silicon oxynitride layer, and/or a low-k dielectric layer.

The cell array structure CS may be provided on the first interlayer insulating layer 50 of the peripheral circuit structure PS. Hereinafter, the cell array structure CS will be described in more detail. A second substrate SL may be provided on the first interlayer insulating layer 50. The second substrate SL may support the gate stacks ST, which are provided thereon.

The second substrate SL may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one of various semiconductor materials (e.g., silicon (Si), germanium (Ge), silicon germanium (SiGe), gallium arsenide (GaAs), indium gallium arsenide (InGaAs), aluminum gallium arsenide (AlGaAs), or mixtures thereof). Each of the lower semiconductor layer LSL, the source semiconductor layer SSL, and the upper semiconductor layer USL may have a single crystalline structure, an amorphous structure, and/or a polycrystalline structure. As an example, each of the lower semiconductor layer LSL, the source semiconductor layer SSL, and the upper semiconductor layer USL may be an n-type doped poly-silicon layer. The lower semiconductor layer LSL, the source semiconductor layer SSL, and the upper semiconductor layer USL may have impurity concentrations different from each other. For example, the impurity concentration of the source semiconductor layer SSL may be higher than the impurity concentration of each of the lower and upper semiconductor layers LSL and USL.

The second substrate SL may include a cell array region CAR and a connection region CNR, as shown in FIG. 5. The cell array region CAR may be provided to be overlapped with a center of the second substrate SL. The connection region CNR may be disposed near at least one of a plurality of sides of the cell array region CAR. The lower semiconductor layer LSL and the upper semiconductor layer USL may be connected to each other through the source semiconductor layer SSL.

Each of the gate stacks ST may include electrodes EL, which are stacked in a direction perpendicular to the second substrate SL (e.g., a third direction D3). In an embodiment, the gate stack ST may include a lower gate stack ST1 and an upper gate stack ST2 on the lower gate stack ST1. The description that follows will refer to an example in which two gate stacks are provided, but in an embodiment, three or more gate stacks may be provided. The lower gate stack ST1 may include first cell insulating layers IL1 separating the stacked electrodes EL from each other. The upper gate stack ST2 may include second cell insulating layers IL2 and the electrodes EL, which are alternately stacked. The first cell insulating layers IL1 and the electrodes EL of the lower gate stack ST1 may be alternately stacked in the third direction D3. The second cell insulating layers IL2 and the electrodes EL of the upper gate stack ST2 may be alternately stacked in the third direction D3. The uppermost one of the second cell insulating layers IL2 in the upper gate stack ST2 may be thicker than the remaining ones of the second cell insulating layers IL2 and the first cell insulating layers ILL which are located below the same. The uppermost one of the first cell insulating layers IL1 in the lower gate stack ST1 may be in contact with the lowermost one of the second cell insulating layers IL2 in the upper gate stack ST2.

The gate stack ST may be extended from the cell array region CAR to the connection region CNR. The gate stack ST may have a stepwise structure on the connection region CNR, as shown in FIGS. 2 to 5. The stepwise structure of the gate stack ST may have a decreasing height, with increasing distance from the cell array region CAR. For example, the stepwise structure of the gate stack ST may have a decreasing height in a second direction D2, which is a direction away from the cell array region CAR. End portions of each of the electrodes EL may be exposed, due to the stepwise structure, and in this case, cell contact plugs CC may be connected to the end portions of each of the electrodes EL.

Among the electrodes EL of the gate stack ST, the lowermost pair of the electrodes EL may be used as the gate electrodes of the lower transistors LT1 and LT2 described with reference to FIG. 1, and the uppermost pair of the electrodes EL may be used as the gate electrodes of the upper transistors UT1 and UT2 described with reference to FIG. 1. The remaining ones of the electrodes EL, except the lowermost and uppermost pairs of the electrodes EL, may be used as the word lines.

Each of the electrodes EL may be formed of or include at least one of doped semiconductor materials (e.g., doped silicon), metallic materials (e.g., tungsten, copper, or aluminum), conductive metal nitrides (e.g., titanium nitride or tantalum nitride), or transition metals (e.g., titanium or tantalum). Each of the first and second insulating layers IL1 and IL2 may be formed of or include silicon oxide.

A plurality of vertical structures VS may be provided on the cell array region CAR to penetrate the gate stack ST. As an example, as shown in FIG. 5, four vertical structures VS may be arranged in a first direction D1 to form a first column C1, and five vertical structures VS may be arranged in the first direction D1 to form a second column C2. The first and second columns C1 and C2 may be repeatedly and alternately arranged in the second direction D2. A diameter of each of the vertical structures VS may gradually decrease with decreasing distance from the second substrate SL. In an embodiment, the vertical structures VS may include a stepped portion, which is located near a boundary between the lower and upper gate stacks ST1 and ST2 and has a discontinuously-varying diameter.

Dummy structures DS may be provided on the connection region CNR to penetrate the gate stack ST. The dummy structures DS may be provided to penetrate the stepwise structure of the gate stack ST. When viewed in a plan view, a size (e.g., the largest diameter) of each of the dummy structures DS may be larger than a size (e.g., the largest diameter) of each of the vertical structures VS.

The vertical structures VS may be respectively provided in channel holes CH penetrating the gate stack ST. Each of the vertical structures VS may include a vertical insulating pattern VP, a vertical semiconductor pattern SP, and an insulating gapfill pattern VI. The vertical semiconductor pattern SP may be interposed between the vertical insulating pattern VP and the insulating gapfill pattern VI. A conductive pad PAD may be provided on each of the vertical structures VS.

The vertical semiconductor pattern SP may be spaced apart from the electrodes EL with the vertical insulating pattern VP interposed therebetween. In other words, the vertical insulating pattern VP, the vertical semiconductor pattern SP, and the insulating gapfill pattern VI may be sequentially provided in the channel hole CH.

The vertical insulating pattern VP may consist of a single thin film or a plurality of thin films. In an embodiment, the vertical insulating pattern VP may include a data storing layer. In an embodiment, the vertical insulating pattern VP may include a tunnel insulating layer TL, a charge storing layer CL, and a blocking insulating layer BIL, which are used as a data storing layer of a NAND FLASH memory device, as shown in FIG. 9.

For example, the charge storing layer CL may be a trap insulating layer, a floating gate electrode, or an insulating layer with conductive nanodots. The charge storing layer CL may include at least one of a silicon nitride layer, a silicon oxynitride layer, a silicon-rich nitride layer, a nanocrystalline silicon layer, and a laminated trap layer. The tunnel insulating layer TL may be formed of or include a material whose band gap is greater than the charge storing layer CL. The tunnel insulating layer TL may be formed of or include one or more high-k dielectric materials (e.g., aluminum oxide and hafnium oxide) or silicon oxide. The blocking insulating layer BIL may include a silicon oxide layer and/or an aluminum oxide layer.

The vertical semiconductor pattern SP may be formed of or include at least one of various semiconductor materials (e.g., silicon (Si), germanium (Ge), or mixtures thereof). In addition, the vertical semiconductor pattern SP may be formed of or include a doped semiconductor material or an undoped intrinsic semiconductor material. In an embodiment, the vertical semiconductor pattern SP may be formed of or include poly silicon. The vertical semiconductor pattern SP including the semiconductor material may be used as channel regions of the transistors of the NAND cell string.

The conductive pad PAD may be on (e.g., may cover) a top surface of the vertical semiconductor pattern SP and a top surface of the insulating gapfill pattern VI. The conductive pad PAD may be formed of or include at least one of doped semiconductor materials and/or metallic materials. A first contact plug CT1 may be electrically connected to the vertical semiconductor pattern SP through the conductive pad PAD.

The source semiconductor layer SSL may be in direct contact with a lower portion of each of the vertical semiconductor patterns SP. The source semiconductor layer SSL may electrically connect the vertical semiconductor patterns SP on the cell array region CAR to each other. In other words, the vertical semiconductor patterns SP of the vertical channel structures VS may be electrically connected to the source semiconductor layer SSL. A common source voltage may be applied to the source semiconductor layer SSL.

Each of the dummy structures DS may include the vertical insulating pattern VP, the vertical semiconductor pattern SP, and the insulating gapfill pattern VI, similar to the vertical structures VS described above. However, the dummy structures DS may not serve as the channel regions of the memory cell transistors, unlike the vertical structures VS. The dummy structures DS may not be electrically connected to the bit lines BL, which will be described in more detail below. In other words, each of the dummy structures DS may be a dummy that does not have any function in terms of a circuit. The dummy structures DS may be used as a pillar (i.e., a supporter) that physically supports the stepwise structure of the gate structure ST mechanically.

A plurality of separation structures SS may be provided to penetrate the gate stack ST. The separation structures SS may be provided in trenches TR, which are formed to penetrate the gate stack ST. The trenches TR may be formed to expose a top surface of the lower semiconductor layer LSL. The separation structures SS may be extended in a second direction D2 and parallel to each other. When viewed in a plan view, each of the separation structures SS may be a line- or bar-shaped pattern extending in the second direction D2. In an embodiment, the separation structures SS may include first separation structures SS1, which are extended from the cell array region CAR to the connection region CNR and divide each electrode EL to a plurality of electrodes EL horizontally. The first separation structures SS1 may be extended into regions between the gate stacks ST to define each of the gate stacks ST. As an example, the first separation structures SS1 may be extended along a region between the first gate stack STa and the second gate stack STb, as shown in FIG. 5.

The separation structures SS may further include second separation structures SS2, which are provided in the connection region CNR and are bar-shape structures spaced apart from each other in the second direction D2. The second separation structures SS2 may be offset/shifted from the first separation structures SS1 in the first direction D1. The second separation structures SS2 may be provided in each of the gate stacks ST. The separation structures SS may be formed of or include at least one of various insulating materials (e.g., silicon oxide).

An interface insulating layer HP may be provided between the electrodes EL and the insulating layers IL1 and IL2. The interface insulating layer HP may be extended into regions between the electrodes EL and the vertical structures VS. The interface insulating layer HP may be on (e.g., may cover) side surfaces of the insulating layers IL1 and IL2, in the trenches TR. In an embodiment, the interface insulating layer HP may be on (e.g., may cover) the top surface of the lower semiconductor layer LSL and the side surface of the source semiconductor layer SSL, in the trenches TR. The interface insulating layer HP may be formed of or include at least one of various metal oxides (e.g., aluminum oxide or hafnium oxide).

A supporting structure SG may be provided on the upper gate stack ST2. The supporting structure SG may include an upper portion, which is pierced by the first contact plugs CT1, and a lower portion, which is pierced by the vertical structures VS. As an example, the supporting structure SG may include a first supporting layer SG1 and a second supporting layer SG2 on the first supporting layer SG1. The first contact plugs CT1 may be provided to penetrate the second supporting layer SG2. Upper portions of the vertical structures VS may penetrate the first supporting layer SG1. An interface between the first and second supporting layers SG1 and SG2 may be located at the same level as (e.g., may be substantially coplanar with) the top surface of the conductive pads PAD. There may be no observable interface between the first and second supporting layers SG1 and SG2, as these layers may include the same material.

A second interlayer insulating layer 160 and the bit lines BL may be sequentially provided on the supporting structure SG. As a result, the supporting structure SG may be between (in the third direction D3) the gate stacks ST and the bit lines BL. Second contact plugs CT2 may be provided in the second interlayer insulating layer 160 to connect the first contact plugs CT1 to the bit lines BL. The second interlayer insulating layer 160 may be formed of or include silicon oxide. The bit lines BL may be extended in the first direction D1 and parallel to each other. A plurality of upper interconnection lines may be disposed on the cell contact plugs CC. Although not shown, the bit lines BL and the upper interconnection lines may be electrically connected to the lower interconnection lines INL of the peripheral circuit structure PS through penetration contacts.

Hereinafter, the supporting structure SG and portions adjacent thereto will be described in more detail with reference to FIGS. 5 to 8.

A thickness H2 of the second supporting layer SG2 of the supporting structure SG may be larger than a thickness H1 of the first supporting layer SG1. As an example, the thickness H2 of the second supporting layer SG2 may be about 3 to about 5 times the thickness H1 of the first supporting layer SG1. For example, the thickness H1 of the first supporting layer SG1 may range from about 800 angstroms (Å) to about 1300 Å, and the thickness H2 of the second supporting layer SG2 may range from about 3000 Å to about 5000 Å. The thickness H2 of the second supporting layer SG2 of the supporting structure SG may be larger than a thickness H3 of the conductive pads PAD. As an example, the thickness H2 of the second supporting layer SG2 may range from about 3 to about 5 times the thickness H3 of the conductive pads PAD. As an example, the thickness H3 of the conductive pads PAD may range from about 700 Å to about 1200 Å. The total thickness of the supporting structure SG (i.e., H1+H2) may be about 4 to about 6 times the thickness H3 of the conductive pads PAD. As an example, the total thickness of the supporting structure SG (i.e., H1+H2) may range from about 4000 Å to about 6000 Å.

A bottom surface SG_u of the supporting structure SG may be lower than top surfaces PAD_t of the conductive pads PAD. The bottom surface SG_u of the supporting structure SG may be higher than bottom surfaces PAD_u of the conductive pads PAD. The thickness H1 of the first supporting layer SG1 may be larger than or equal to half of the thickness H3 of the conductive pads PAD.

A top surface of the first supporting layer SG1 may be coplanar with the top surfaces PAD_t of the conductive pads PAD and the top surface of the vertical insulating pattern VP. A top surface of the second supporting layer SG2 may be coplanar with the top surfaces of the first contact plugs CT1.

The supporting structure SG may include a plurality of openings OP, which are provided on the separation structures SS. As an example, in the cell array region CAR, a plurality of first openings OP1 may be provided on each of the first separation structures SS1 and may be arranged in the second direction D2, as shown in FIG. 5. In the connection region CNR, a second opening OP2 may be provided on the first separation structures SS1. Each of the second opening OP2 may be longer than each of the first openings OP1, when measured in the second direction D2. As an example, each of the second openings OP2 may be disposed on a corresponding one of the first separation structures SS1, but the inventive concept is not limited to this example. In the connection region CNR, a third opening OP3 may be disposed on each of the second separation structures SS2. Each of the third openings OP3 may be disposed on a corresponding one of the second separation structures SS2, but in an embodiment, a plurality of third openings OP3 may be disposed on each of the second separation structures SS2. The third opening OP3 may have a length, which is similar to each of the second separation structures SS2, in the second direction D2, as shown in FIG. 5, but in an embodiment, the third opening OP3 may have a length, which is shorter than the second separation structures SS2, in the second direction D2.

In the cell array region CAR, the first openings OP1, which are disposed on adjacent ones of the first separation structures SS1, may be shifted (i.e., offset) from each other in the second direction D2, and as a result, the first openings OP1 may be disposed in a zigzag shape, as shown in FIG. 5. For example, the first openings OP1 on one of the first separation structures SS1 may be shifted from the first openings OP1 on another of the first separation structures SS1 adjacent thereto, in the second direction D2. However, in an embodiment, the first openings OP1 may not be disposed in the zigzag shape and may be aligned to each other in the first direction D1. Portions of the supporting structure SG, which are located between the first openings OP1 adjacent to each other in the second direction D2, will be referred to as bridge portions BG. The bridge portions BG may be used to support mold structures, which are divided by the trenches, in a fabrication process of a semiconductor device to be described below.

Each of the first separation structures SS1 may include first portions SSa, which are overlapped with the first openings OP1, and second portions SSb, which are not overlapped with the first openings OP1. Top surfaces of the first portions SSa may be located at a level that is higher than top surfaces of the second portions SSb. The top surfaces of the second portions SSb may be lower than the top surfaces PAD_t of the conductive pads PAD. The bridge portions BG may be provided on the second portions SSb. The first portions SSa may be extended from the trench TR into the first openings OP1, as shown in FIG. 7. In the first openings OP1, the interface insulating layer HP may be extended into a region between the first portions SSa and the side surface of the supporting structure SG. As an example, the interface insulating layer HP may be on (e.g., may cover) the side surface of the supporting structure SG. The second portions SSb of each of the first separation structures SS1 may have thereon (e.g., may be covered with) the supporting structure SG, as shown in FIG. 8. The bridge portions BG on the trenches TR support the gate stacks ST, which are adjacent to each other. The interface insulating layer HP may be extended into regions between the top surfaces of the second portions SSb and the bottom surface of the supporting structure SG. As an example, the interface insulating layer HP may be in contact with the bottom surface of the supporting structure SG. The top surface of the interface insulating layer HP may be lower than the top surfaces of the conductive pads PAD.

Due to the afore-described structure, an upper portion of each of the first separation structures SS1 may include protruding portions (e.g., upper portions of the first portions SSa), which are spaced apart from each other. A width, in the first direction D1, of a first portion of the first separation structure SS1 provided in the first opening OP1 may be larger than a width, in the first direction D1, of a second portion of the first separation structure SS1 provided in the trench TR.

The supporting structure SG may be formed of or include a material, which has hardness greater than the first and second insulating layers IL1 and IL2. As an example, the supporting structure SG may be formed of or include a material whose hardness is about 1.1 to 3 times greater than the first and second insulating layers IL1 and IL2. The supporting structure SG may be formed of or include at least one of silicon oxide, silicon oxynitride, or silicon carbonitride. The first and second insulating layers IL1 and IL2 may be formed of or include silicon oxide. A hydrogen concentration of the supporting structure SG may be lower than hydrogen concentrations of the first and second insulating layers IL1 and IL2. The supporting structure SG may include a material capable of reducing stress to be exerted on a silicon substrate, compared with the first and second insulating layers IL1 and IL2. As an example, the stress, which is exerted on the silicon substrate by the supporting structure SG, may be about 70% to 80% of the stress by the first and second insulating layers IL1 and IL2.

Structural features of a lower portion of the vertical structure VS will be described in more detail with reference to FIGS. 5 and 9.

The lower portion of the vertical structure VS may include an air gap OV. As an example, at least a portion of the air gap OV may be disposed at the same level as the source semiconductor layer SSL. The air gap OV may be a region, in which a solid material is not provided, and may be a space, which is in a vacuum state or is filled with a gaseous material. The source semiconductor layer SSL may be horizontally extended to penetrate the vertical insulating pattern VP. The vertical insulating pattern VP may include a lower pattern BOP and an upper pattern SOP, which are spaced apart from each other with the source semiconductor layer SSL filling an undercut region UC interposed therebetween. The undercut region UC may be provided around the vertical semiconductor pattern SP and in the form of a ring and may be filled with the source semiconductor layer SSL. A thickness of the source semiconductor layer SSL in the third direction D3 may be larger in a region between the lower pattern BOP and the upper pattern SOP than in other regions (e.g., under the upper semiconductor layer USL). As an example, the source semiconductor layer SSL may include two vertically-protruding portions, which are respectively extended toward the lower pattern BOP and the upper pattern SOP. The insulating gapfill pattern VI may be formed of or include at least one of silicon oxide and/or silicon oxynitride.

According to an embodiment of the inventive concept, adjacent ones of the gate stacks ST may be connected to each other through the bridge portions BG and may support each other, and thus, it may be possible to prevent or suppress a collapse issue or a structural instability issue of a stacking structure from occurring before a gate-electrode-forming step in a fabrication process of a semiconductor device. In addition, according to an embodiment of the inventive concept, the bridge portion may be formed to have a bottom surface lower than the top surface of the conductive pad, and thus, the stacking structures may be robustly supported by the supporting structure. Accordingly, it may be possible to prevent/protect the reliability of the semiconductor device from being deteriorated.

Figure 10:
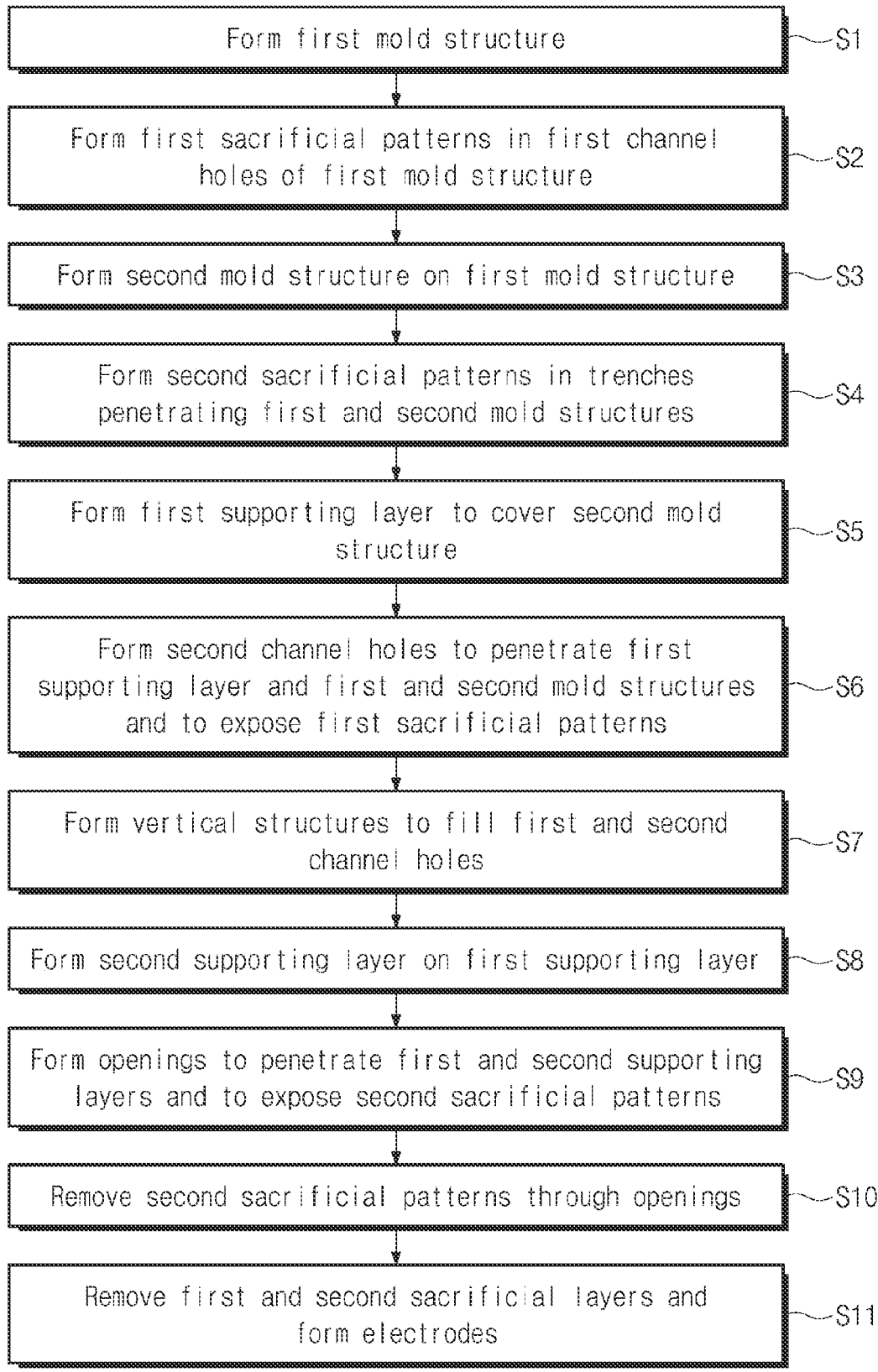
FIG. 10 is a flow chart illustrating a method of fabricating a semiconductor device, according to an embodiment of the inventive concept.

FIG. 10 is a flow chart illustrating a method of fabricating a semiconductor device, according to an embodiment of the inventive concept. FIGS. 11 to 18 are sectional views, which are respectively taken along a line A-A' of FIG. 5 to illustrate a method of fabricating a semiconductor device, according to an embodiment of the inventive concept. For concise description, a previously described element may be identified by the same reference number without repeating an overlapping description thereof.

Figure 11:
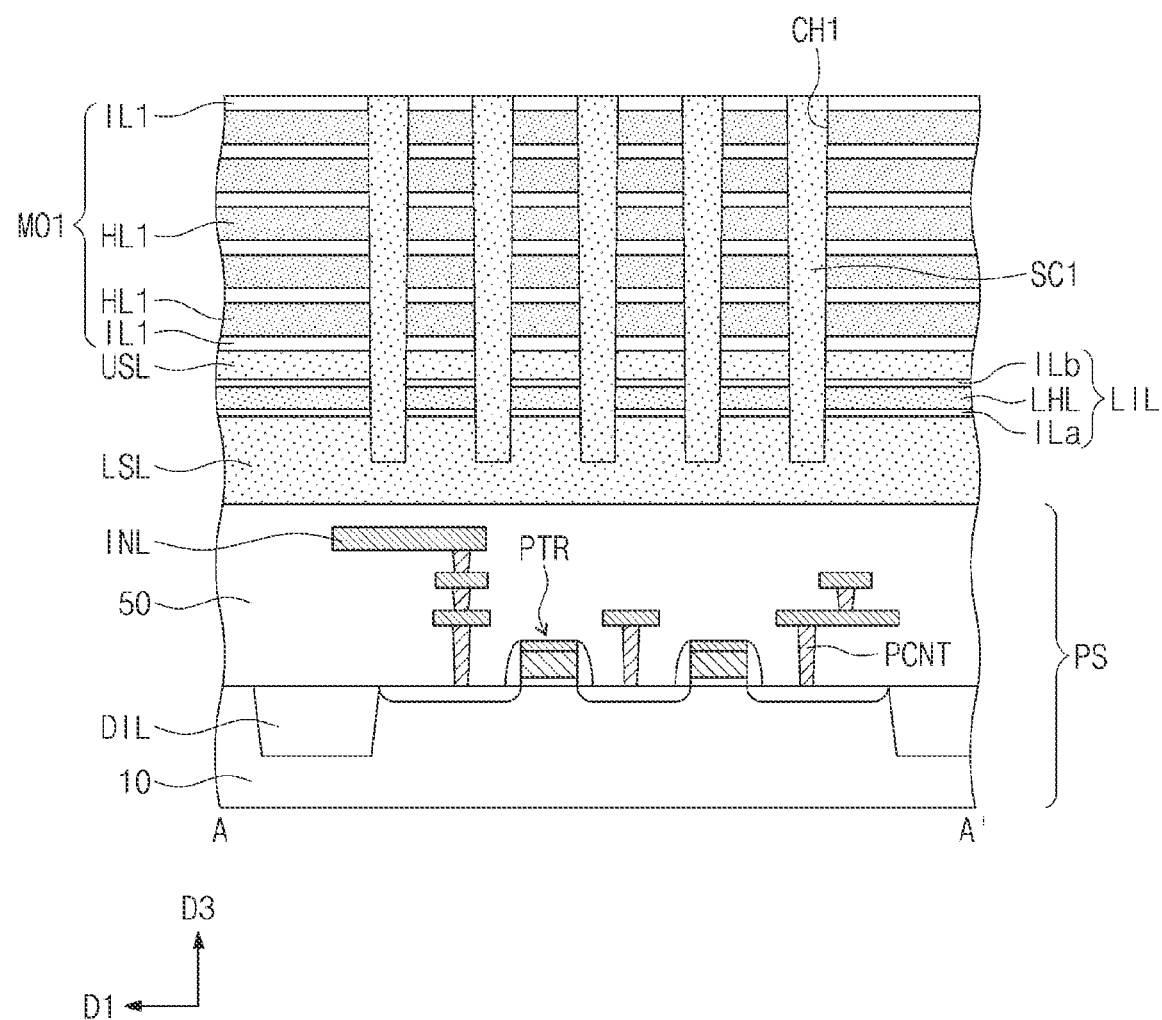
FIGS. 11 to 18 are sectional views, which are respectively taken along a line A-A' of FIG. 5 to illustrate a method of fabricating a semiconductor device, according to an embodiment of the inventive concept.

Referring to FIGS. 10 and 11, the peripheral circuit structure PS may be formed on the first substrate 10. The formation of the peripheral circuit structure PS may include forming the peripheral transistors PTR on the first substrate 10 and forming the lower interconnection lines INL on the peripheral transistors PTR. For example, the formation of the peripheral transistors PTR may include forming the device isolation layer DIL on the first substrate 10 to define active regions, forming a gate insulating layer and a gate electrode on the active regions, and injecting impurities into the active regions to form source/drain regions. The first interlayer insulating layer 50 may be formed on (e.g., to cover) the peripheral transistors PTR and the lower interconnection lines INL.

The lower semiconductor layer LSL may be formed on the first interlayer insulating layer 50. For example, the lower semiconductor layer LSL may be formed of or include at least one of semiconductor materials (e.g., polysilicon). An insulating structure LIL may be formed on the lower semiconductor layer LSL. The formation of the insulating structure LIL may include sequentially forming a lower insulating layer ILa, a lower sacrificial layer LHL, and an upper insulating layer ILb on the lower semiconductor layer LSL. The upper and lower insulating layers ILa and ILb may be formed of or include silicon oxide, and the lower sacrificial layer LHL may be formed of or include at least one of silicon nitride or silicon oxynitride.

The upper semiconductor layer USL may be conformally formed on the insulating structure LIL. For example, the upper semiconductor layer USL may be formed of or include at least one of various semiconductor materials (e.g., polysilicon).

A first mold structure MO1 may be formed on the upper semiconductor layer USL (Block Si). In detail, the first mold structure MO1 may be formed by alternately stacking the first cell insulating layers IL1 and first sacrificial layers HL1 on the upper semiconductor layer USL. The first cell insulating layer IL1 may be formed as the uppermost layer of the first mold structure MO1. The first cell insulating layers IL1 and the first sacrificial layers HL1 may be deposited using a thermal chemical vapor deposition (thermal CVD) process, a plasma-enhanced CVD (PE-CVD) process, a physical CVD process, or an atomic layer deposition (ALD) process. The first cell insulating layers IL1 may be formed of or include silicon oxide, and the first sacrificial layers HL1 may be formed of or include silicon nitride or silicon oxynitride.

First channel holes CH1 may be formed to penetrate the first mold structure MO1 and the insulating structure LIL. The first channel holes CH1 may be formed by an anisotropic etching process. The anisotropic etching process may include a plasma etching process, a reactive ion etching (RIE) process, an inductively-coupled-plasma reactive-ion-etching (ICP-RIE) process, or an ion beam etching (IBE) process.

Lower portions of the first channel holes CH1 may be formed in the upper semiconductor layer USL. First sacrificial patterns SC1 may be formed to fill the first channel holes CH1 (Block S2). The first sacrificial patterns SC1 may be formed of or include a material having an etch selectivity with respect to the first cell insulating layers IL1 and the first sacrificial layers HL1. As an example, the first sacrificial patterns SC1 may be formed of or include poly silicon. The formation of the first sacrificial patterns SC1 may include a planarization process, and as a result, the topmost layer of the first cell insulating layers IL1 may be exposed.

Figure 12:
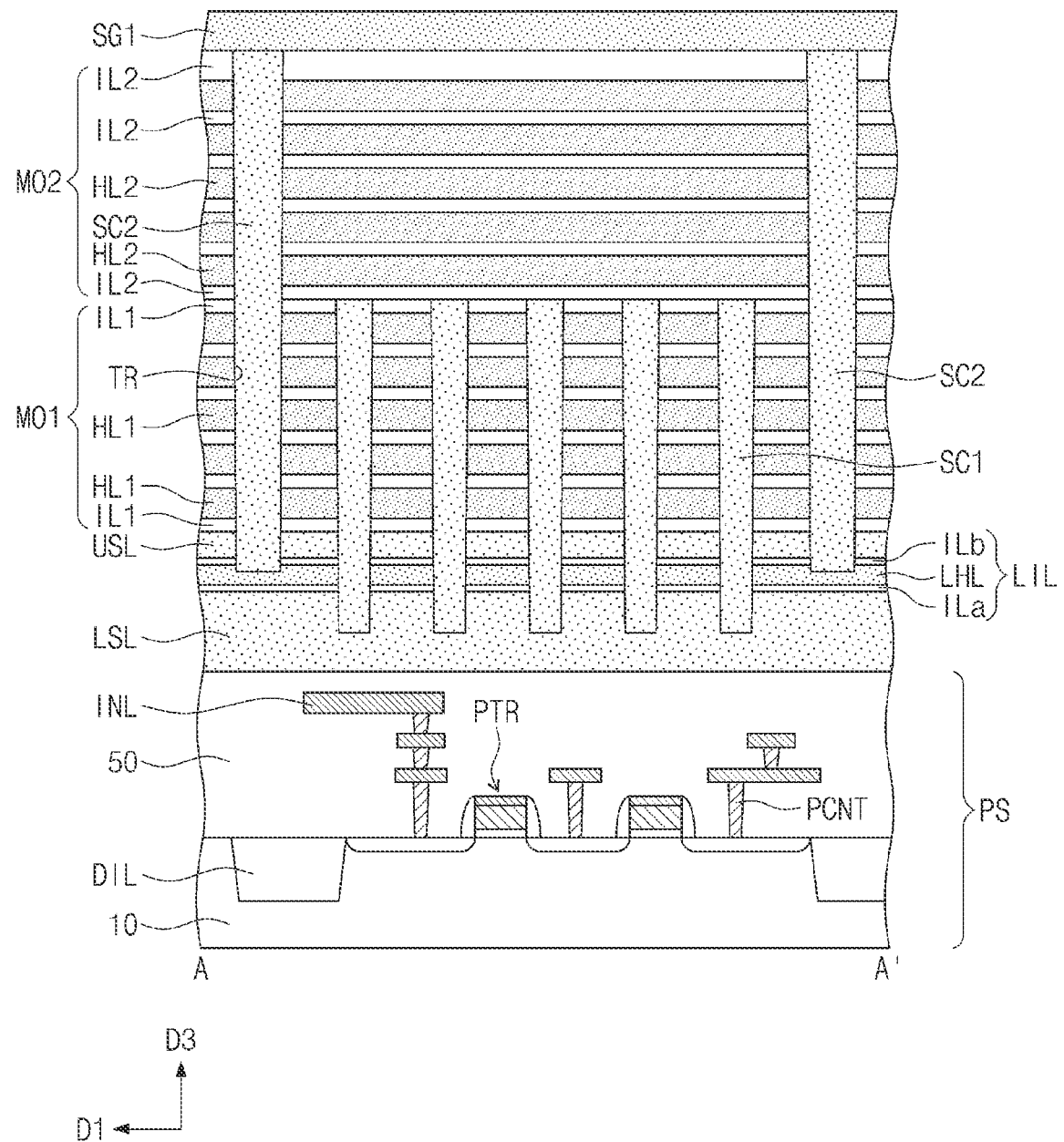

Referring to FIGS. 10 and 12, a second mold structure MO2 may be formed on the first mold structure MO1 (Block S3). The second mold structure MO2 may be formed by alternately depositing the second cell insulating layers IL2 and second sacrificial layers HL2. The second cell insulating layers IL2 may be formed of or include the same material as the first cell insulating layers IL1. The second sacrificial layers HL2 may be formed of or include the same material as the first sacrificial layers HL1. The uppermost one of the second cell insulating layers IL2 may be formed to be thicker than the others of the second cell insulating layers IL2 disposed therebelow.

The trenches TR may be formed to penetrate the second mold structure MO2 and the first mold structure MO1 and to extend in the second direction D2. The trenches TR may be formed by an anisotropic etching process. Lower portions of the trenches TR may expose the lower sacrificial layer LHL. Second sacrificial patterns SC2 may be formed to fill the trenches TR (Block S4). The second sacrificial patterns SC2 may be formed of or include a material having an etch selectivity with respect to the first and second insulating layers IL1 and IL2 and first and second sacrificial layers HL1 and HL2. As an example, the second sacrificial patterns SC2 may be formed of or include poly silicon. Before the formation of the second sacrificial patterns SC2, spacers may be formed on (e.g., to cover) side surfaces of the trenches TR and to expose bottom surfaces of the trenches TR.

The first supporting layer SG1 may be formed on (e.g., to cover) the second mold structure MO2 and the second sacrificial patterns SC2 (Block S5). The first supporting layer SG1 may be in contact with the uppermost layer of the second cell insulating layers IL2. The first supporting layer SG1 may be formed by a chemical vapor deposition process and/or an atomic layer deposition process. The first supporting layer SG1 may be formed of or include at least one of silicon oxide, silicon oxynitride, or silicon carbonitride. Even in the case that all of the first supporting layer SG1 and the first and second insulating layers IL1 and IL2 are formed of silicon oxide, by adjusting source materials in their CVD processes, it may be possible to make a difference in their compositions and properties.

Figure 13:
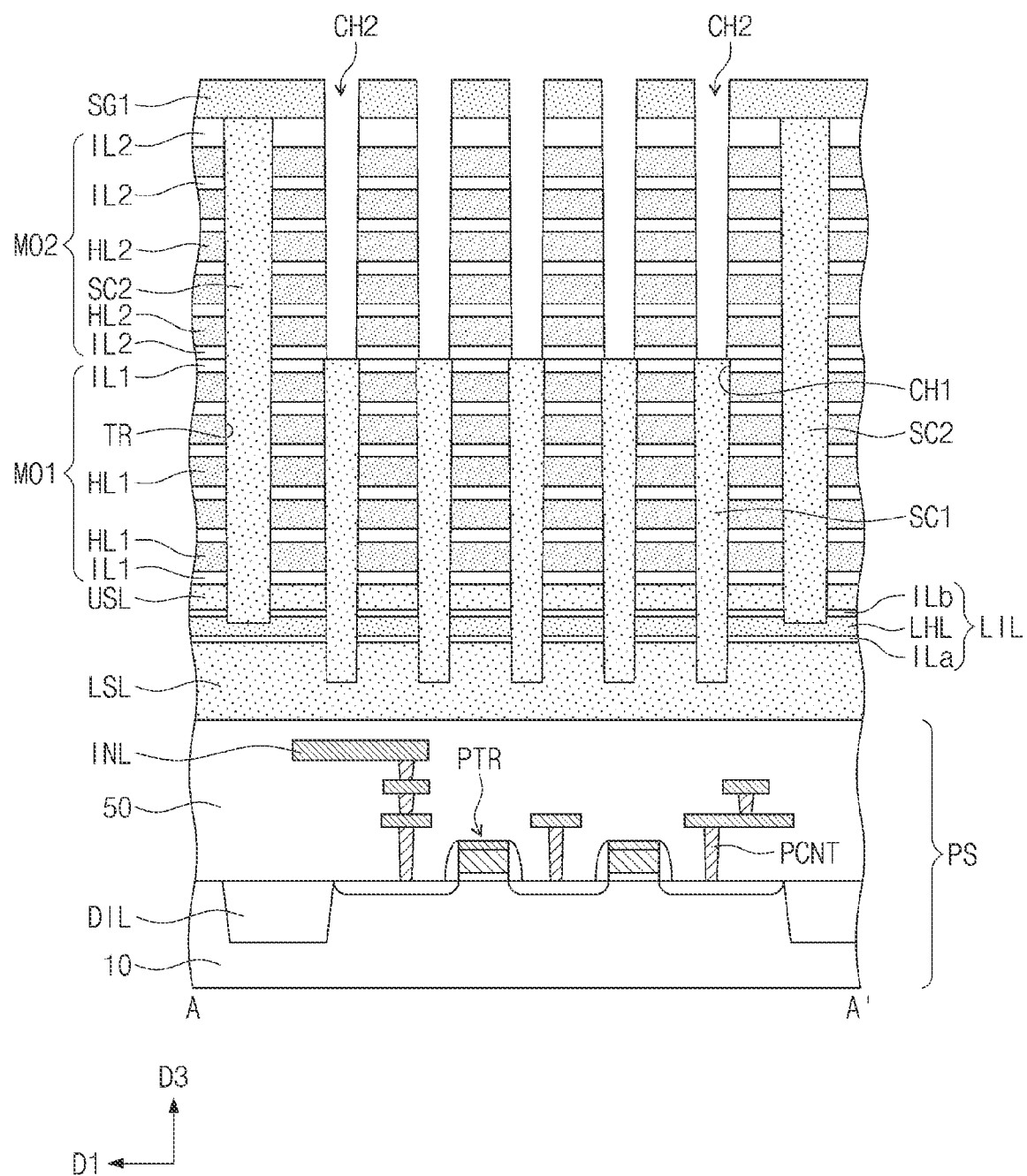

Referring to FIGS. 10 and 13, second channel holes CH2 may be formed to penetrate the first supporting layer SG1 and the second mold structure MO2 and to expose the first sacrificial patterns SC1 (Block S6). The formation of the second channel holes CH2 may include forming a hard mask pattern on the first supporting layer SG1 and performing an etching process using the hard mask pattern as an etch mask.

Figure 14:
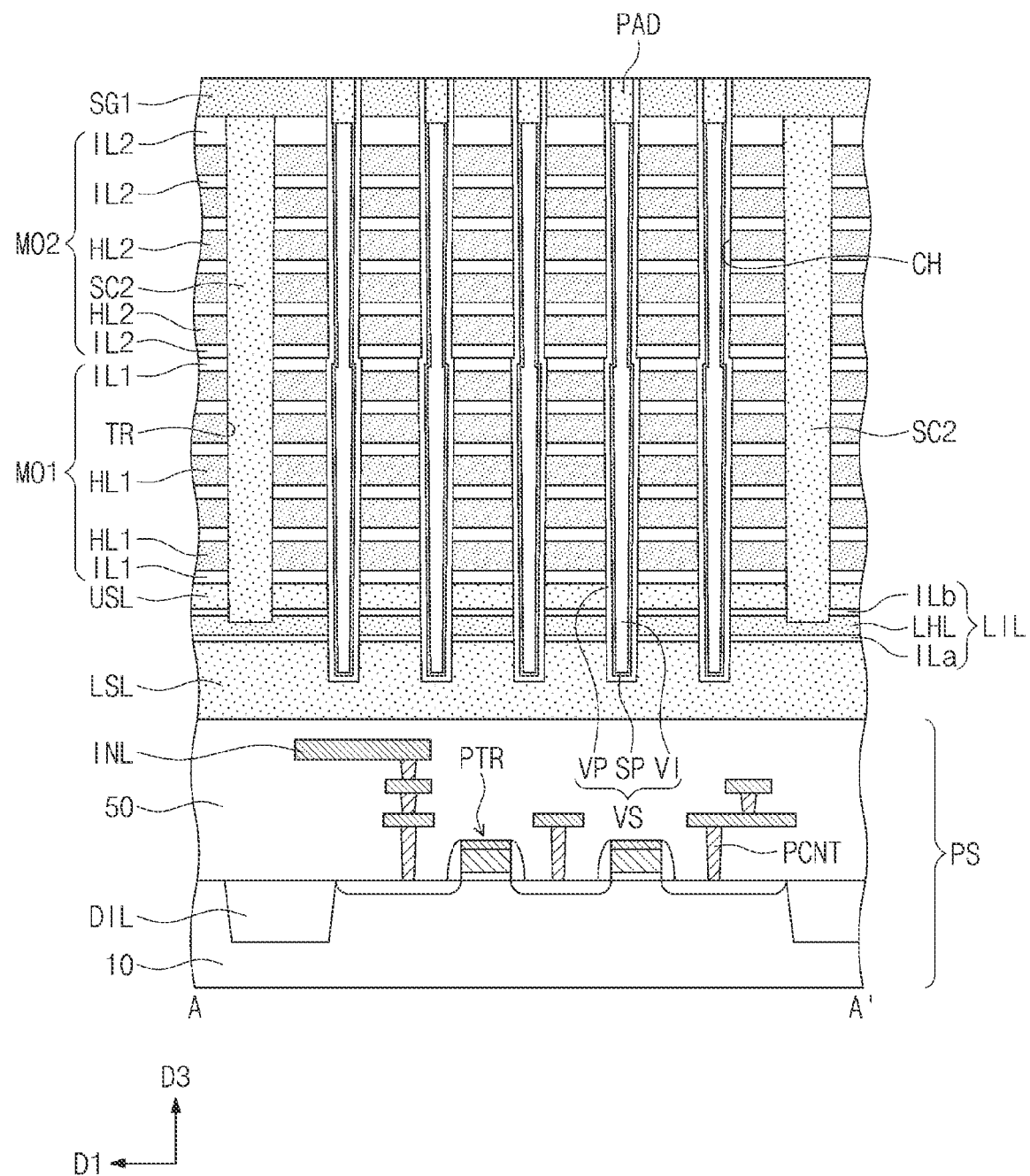

Referring to FIGS. 10 and 14, the first sacrificial patterns SC1 may be selectively removed through the second channel holes CH2. The selective removal of the first sacrificial patterns SC1 may be performed using an etchant containing hydrofluoric acid. Hereinafter, a structure including the first and second channel holes CH1 and CH2, which are connected to each other, may be referred to as the channel hole CH. The vertical structures VS may be formed in (e.g., to fill) the channel holes CH (Block S7). The vertical structures VS may be formed by sequentially forming the vertical insulating pattern VP, the vertical semiconductor pattern SP, and the insulating gapfill pattern VI in the channel holes CH. The conductive pad PAD may be formed in or on an upper portion of each of the vertical structures VS. The conductive pad PAD may be formed of or include at least one of doped semiconductor materials or conductive materials. The formation of the vertical structures VS may include a planarization process, and as a result, a top surface of the first supporting layer SG1 may be located at the same level as (e.g., may be substantially coplanar with) the top surface of the conductive pad PAD.

Figure 15:
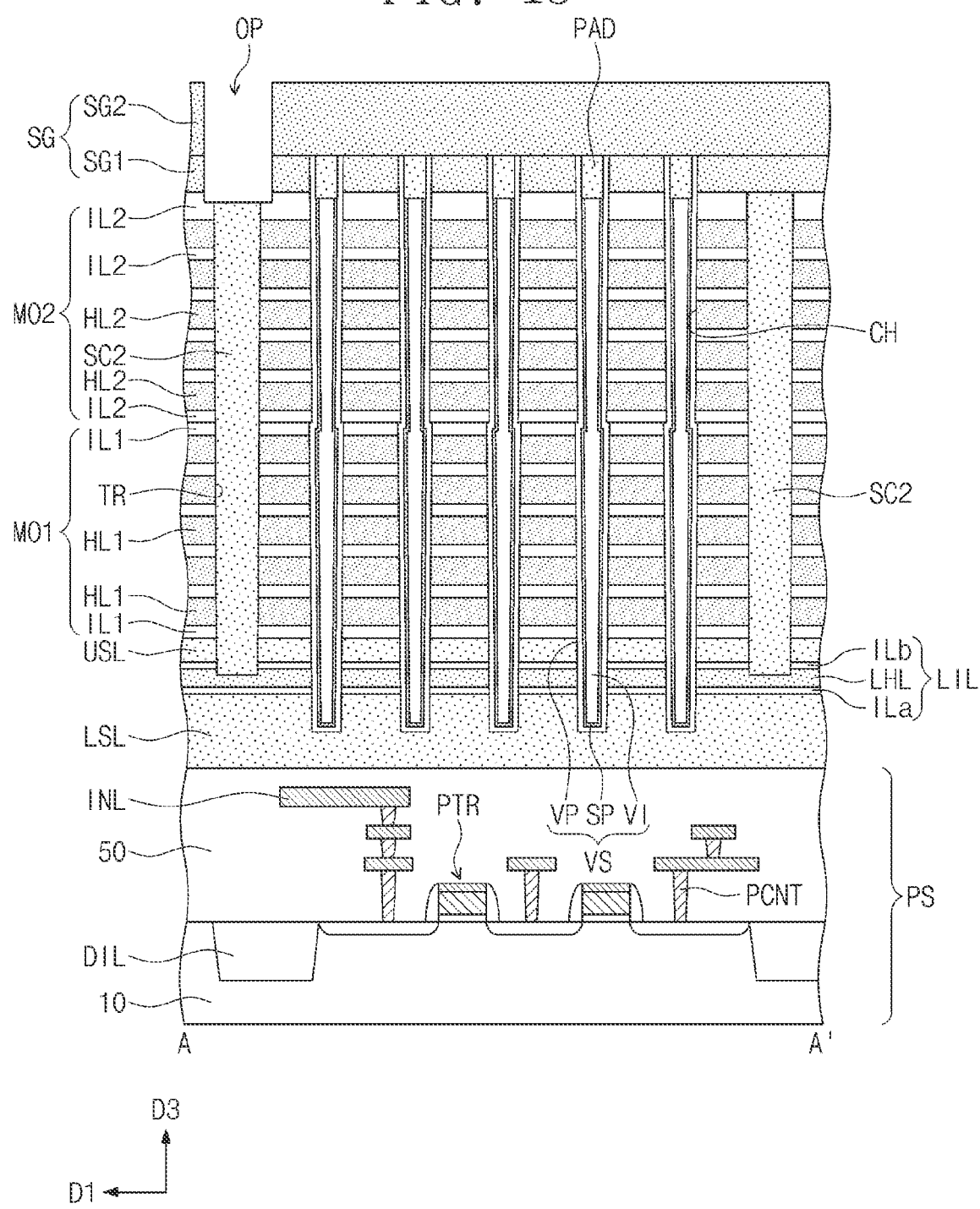

Referring to FIGS. 10 and 15, the second supporting layer SG2 may be formed on the first supporting layer SG1 (Block S8). The second supporting layer SG2 may be formed of the same material as the first supporting layer SG1 and may be formed by the same method as the first supporting layer SG1. The second supporting layer SG2 may be formed to be thicker than the first supporting layer SG1. The openings OP may be formed to penetrate the second supporting layer SG2 and the first supporting layer SG1 and to expose the second sacrificial patterns SC2 (Block S9). The openings OP may be formed by an anisotropic etching process, such as a plasma etching process or a reactive ion etching process. Upper portions of the second sacrificial patterns SC2 may also be removed during the formation of the openings OP.

Figure 16:
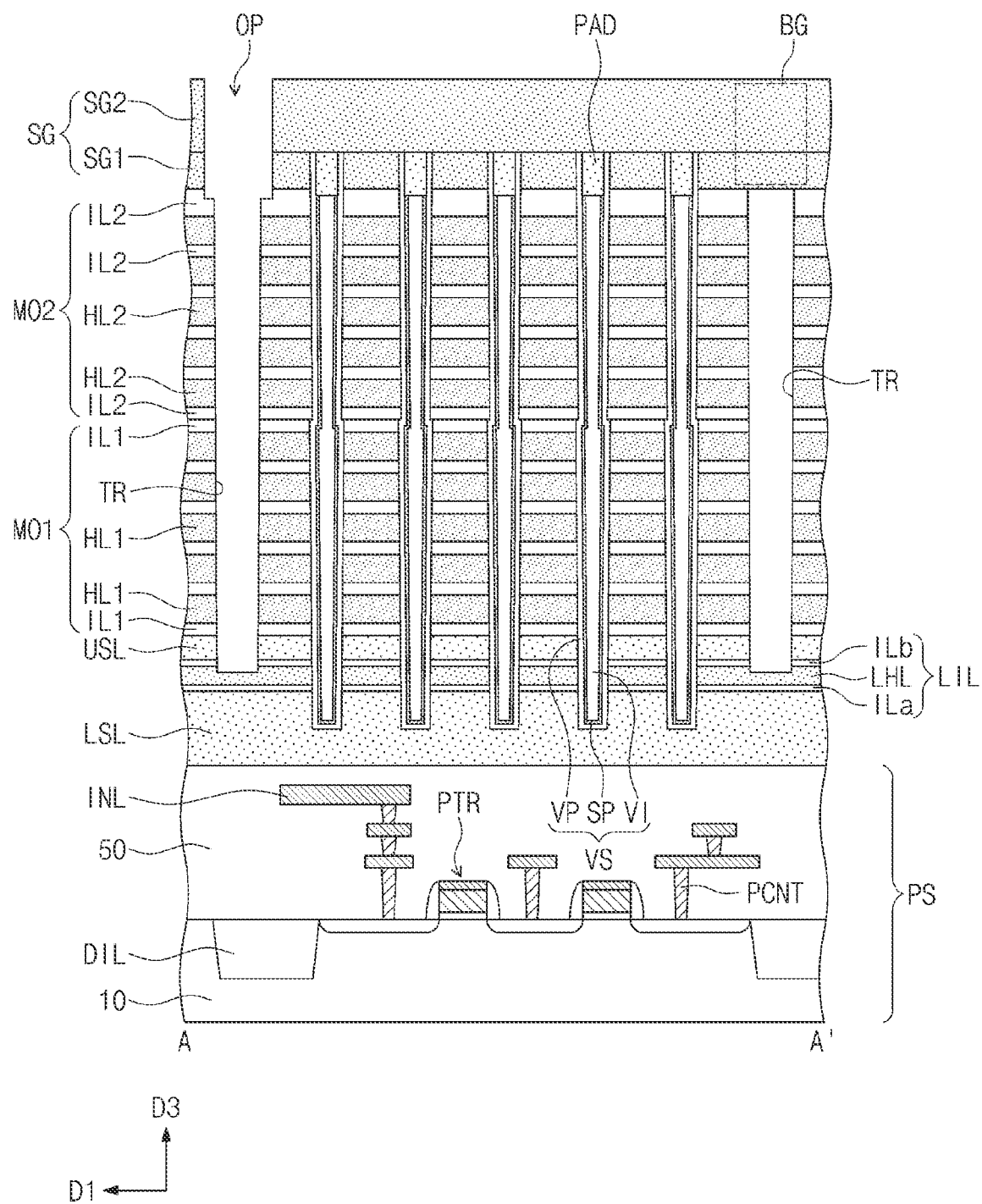

Referring to FIGS. 10 and 16, the second sacrificial patterns SC2 may be removed through the openings OP (Block S10). Accordingly, the trenches TR may be again exposed. The selective removal of the second sacrificial patterns SC2 may be performed using an etchant containing hydrofluoric acid. The supporting structure SG may include the bridge portions BG, in which the openings OP are not formed, and the bridge portions BG may support the mold structures MO1 and MO2, on the trenches TR which are evacuated by removing the second sacrificial patterns SC2.

Figure 17:
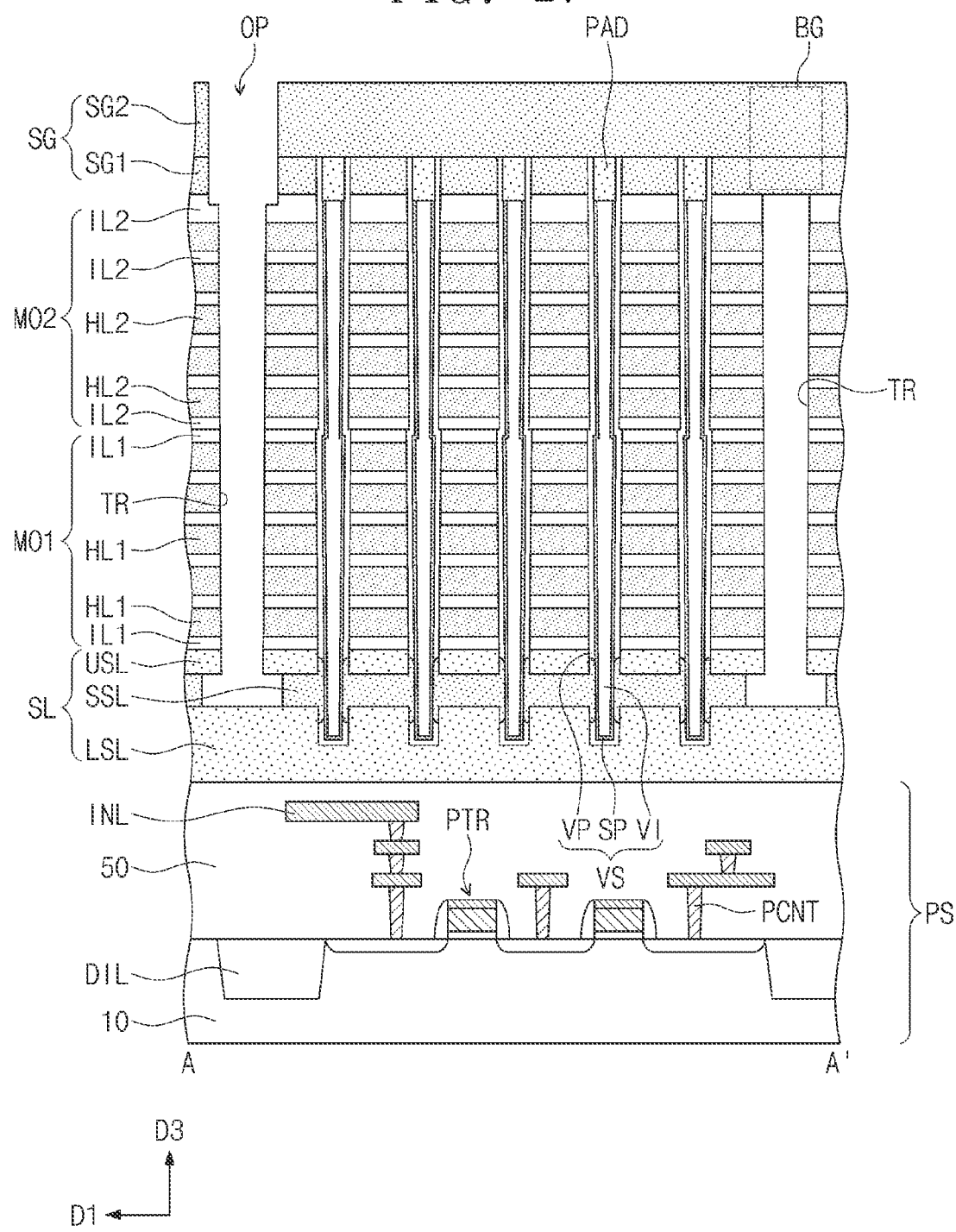

Referring to FIGS. 10 and 17, the lower sacrificial layer LHL, which is exposed by the trenches TR, may be replaced with the source semiconductor layer SSL. In detail, the lower sacrificial layer LHL may be selectively removed through the trenches TR. As a result of the removal of the lower sacrificial layer LHL, a lower portion of the vertical insulating pattern VP may be exposed. The exposed lower portion of the vertical insulating pattern VP may be removed to form the undercut region UC (e.g., see FIG. 9). The undercut region UC may be formed to expose a lower portion of the vertical semiconductor pattern SP. The lower and upper insulating layers ILa and ILb may also be removed during the removing of the lower portion of the vertical insulating pattern VP. The source semiconductor layer SSL may be formed in a space, from which the insulating structure LIL is removed. The source semiconductor layer SSL may be in contact with the vertical semiconductor pattern SP.

Figure 18:
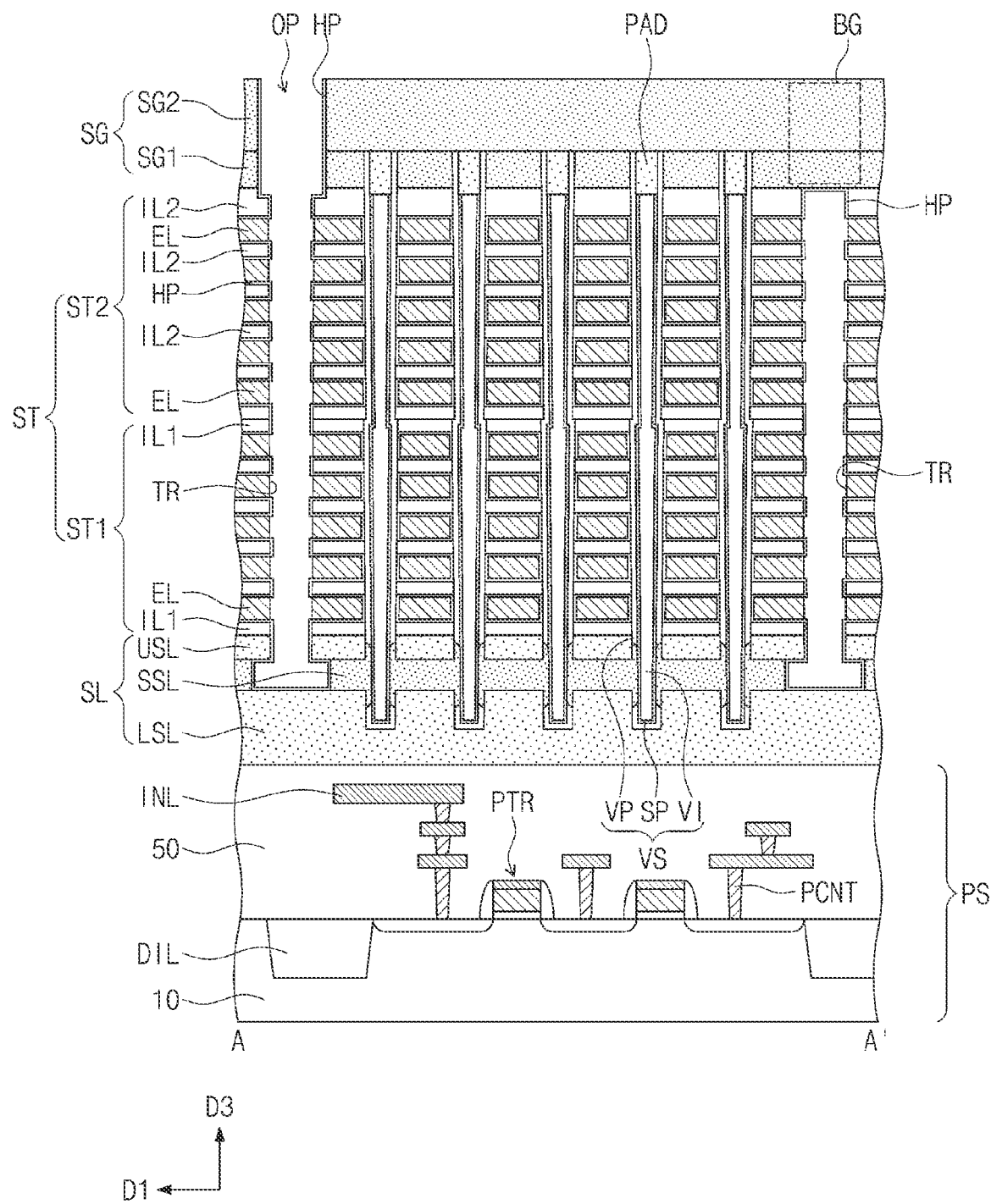

Referring to FIGS. 10 and 18, the gate stacks ST may be formed by replacing the sacrificial layers HL1 and HL2, which are exposed by the trenches TR, with the electrodes EL, respectively. In detail, the sacrificial layers HL1 and HL2, which are exposed through the trenches TR, may be selectively removed. The electrodes EL may be respectively formed in spaces, which are formed by removing the sacrificial layers HL1 and HL2 (Block S11). Before the formation of the electrodes EL, the interface insulating layer HP may be formed.

The removal of the sacrificial layers HL1 and HL2 may weaken the structural stability of the first and second mold structures MO1 and MO2, which are spaced apart from each other with the trenches TR interposed therebetween, and thus, a collapsing or leaning issue may occur in the mold structure. However, according to an embodiment of the inventive concept, adjacent ones of the mold structures may be connected to each other by the bridge portions BG on the trenches TR, and thus, the mold structures may be robustly supported, when the process of forming the electrodes EL is performed after the removal of the sacrificial layers HL1 and HL2.

Referring back to FIG. 6, the separation structure SS may be formed in the trenches TR by filling the trenches TR with an insulating material. The first contact plugs CT1 may be formed to penetrate the supporting structure SG and to be coupled to the conductive pads PAD, respectively. The second interlayer insulating layer 160 and the second contact plugs CT2 penetrating the same may be formed on the separation structure SS. Thereafter, the bit lines BL may be formed on the second interlayer insulating layer 160.

Figure 19:
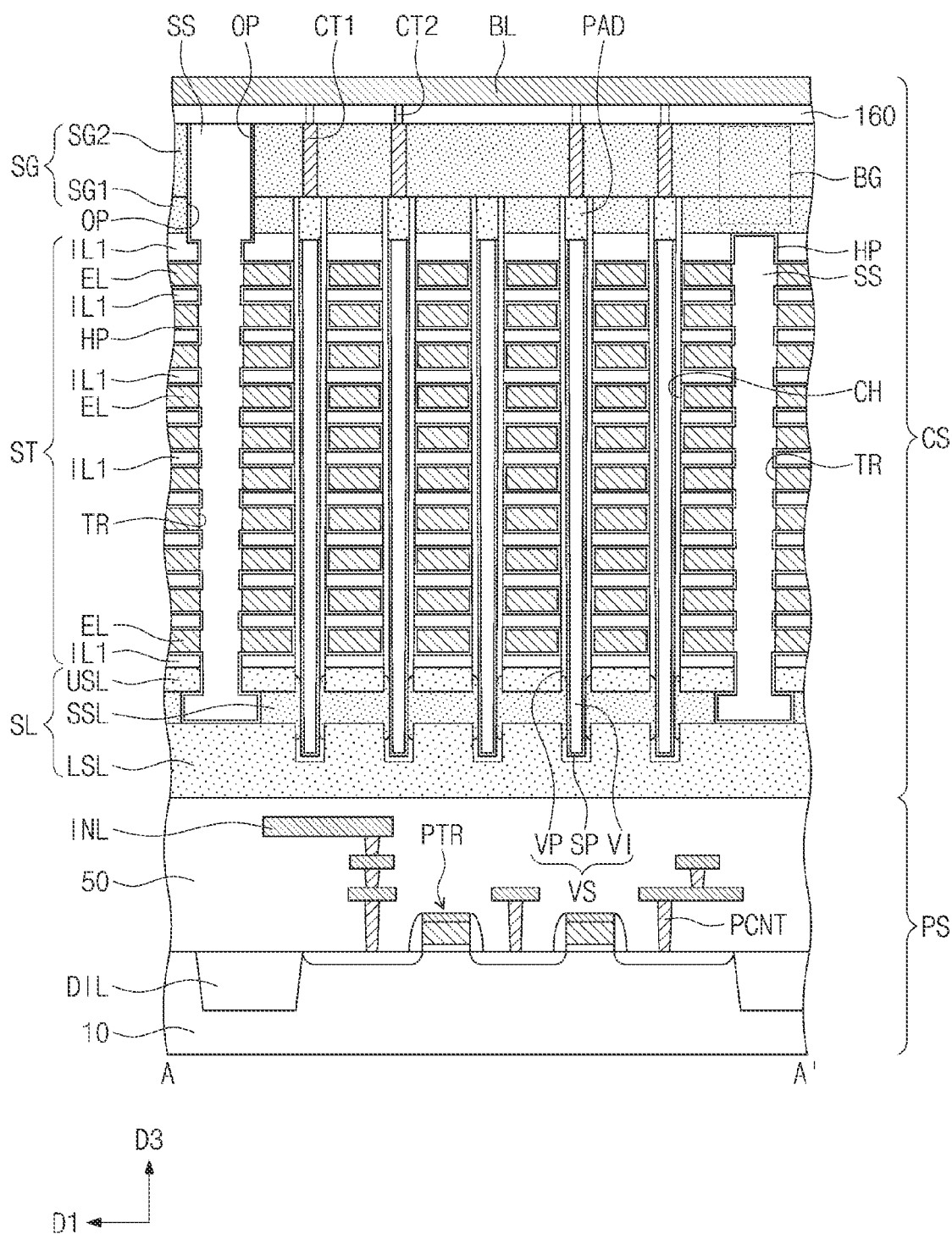
FIG. 19 is a sectional view, which is taken along the line A-A' of FIG. 5 to illustrate a semiconductor device according to an embodiment of the inventive concept.

FIG. 19 is a sectional view, which is taken along the line A-A' of FIG. 5 to illustrate a semiconductor device according to an embodiment of the inventive concept. For concise description, a previously described element may be identified by the same reference number without repeating an overlapping description thereof.

Referring to FIG. 19, the gate stack ST according to the present embodiment may have a structure which is not separated into distinct gate stacks (e.g., the lower gate stack ST1 and the upper gate stack ST2 of FIG. 6). This may be because a single mold structure is used to form the gate stack ST, which includes the electrodes EL and the first cell insulating layers ILL as will be described with reference to FIG. 20. As a result, the vertical structures VS may not have the stepped portion (e.g., of FIG. 6) whose diameter is discontinuously changed near a boundary between the lower and upper gate stacks ST1 and ST2.

Figure 20:
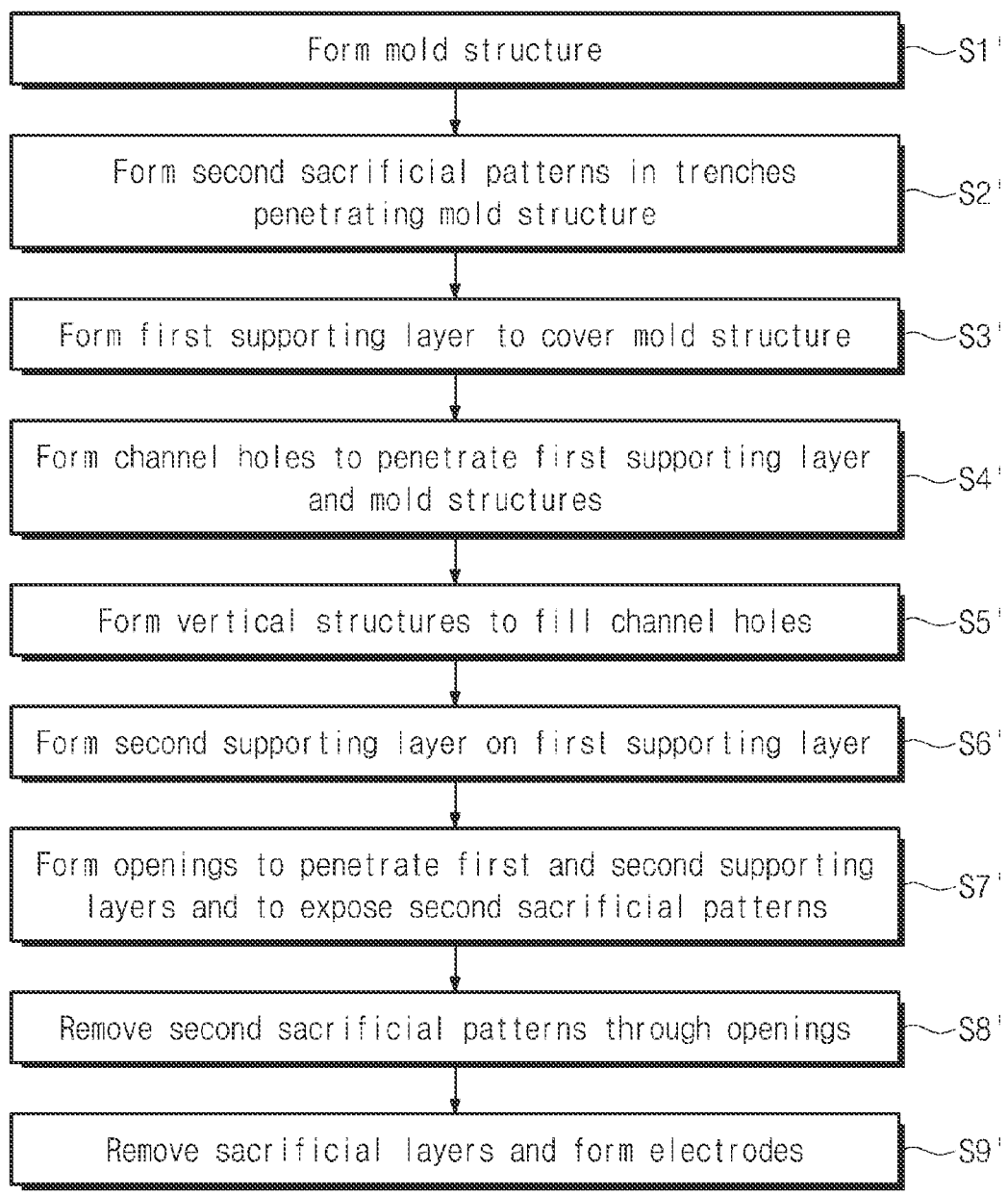
FIG. 20 is a flow chart illustrating a method of fabricating a semiconductor device, according to an embodiment of the inventive concept (in particular, according to the embodiment of FIG. 19).

FIG. 20 is a flow chart illustrating a method of fabricating a semiconductor device, according to an embodiment of the inventive concept (in particular, according to the embodiment of FIG. 19). The description that follows will mainly refer to features that are different from those in the embodiment of FIG. 10, for the sake of brevity.

Referring to FIGS. 5, 19, and 20, a mold structure may be formed on the upper semiconductor layer USL (Block S1'). The mold structure may be formed by alternately stacking the first cell insulating layers IL1 and first sacrificial layers on the upper semiconductor layer USL. The trenches TR may be formed to penetrate the mold structure and to extend in the second direction D2. Second sacrificial patterns may be formed in (e.g., to fill) the trenches TR (Block S2'). In the present embodiment, it may be possible to omit the step of forming the first channel holes and the first sacrificial patterns before the formation of the trenches TR, described with reference to FIG. 11, unlike the embodiment of FIG. 10.

The first supporting layer SG1 may be formed on (e.g., to cover) the mold structure and the second sacrificial patterns (Block S3'). The channel holes CH may be formed to penetrate the first supporting layer SG1 and the mold structure (Block S4'). The channel holes CH may be formed to expose the lower semiconductor layer LSL. Thereafter, the vertical structures VS may be formed in (e.g., to fill) the channel holes CH (Block S5').

The subsequent process may be performed in the same manner as in the embodiment of FIG. 10. For example, the second supporting layer SG2 may be formed on the first supporting layer SG1 (Block S6'). The openings OP may be formed to penetrate the second supporting layer SG2 and the first supporting layer SG1 and to expose the second sacrificial patterns SC2 (Block S7'). The second sacrificial patterns SC2 may be removed through the openings OP (Block S8'). The electrodes EL may be respectively formed in empty regions, which are formed by removing the sacrificial layers (Block S9').

Figure 21:
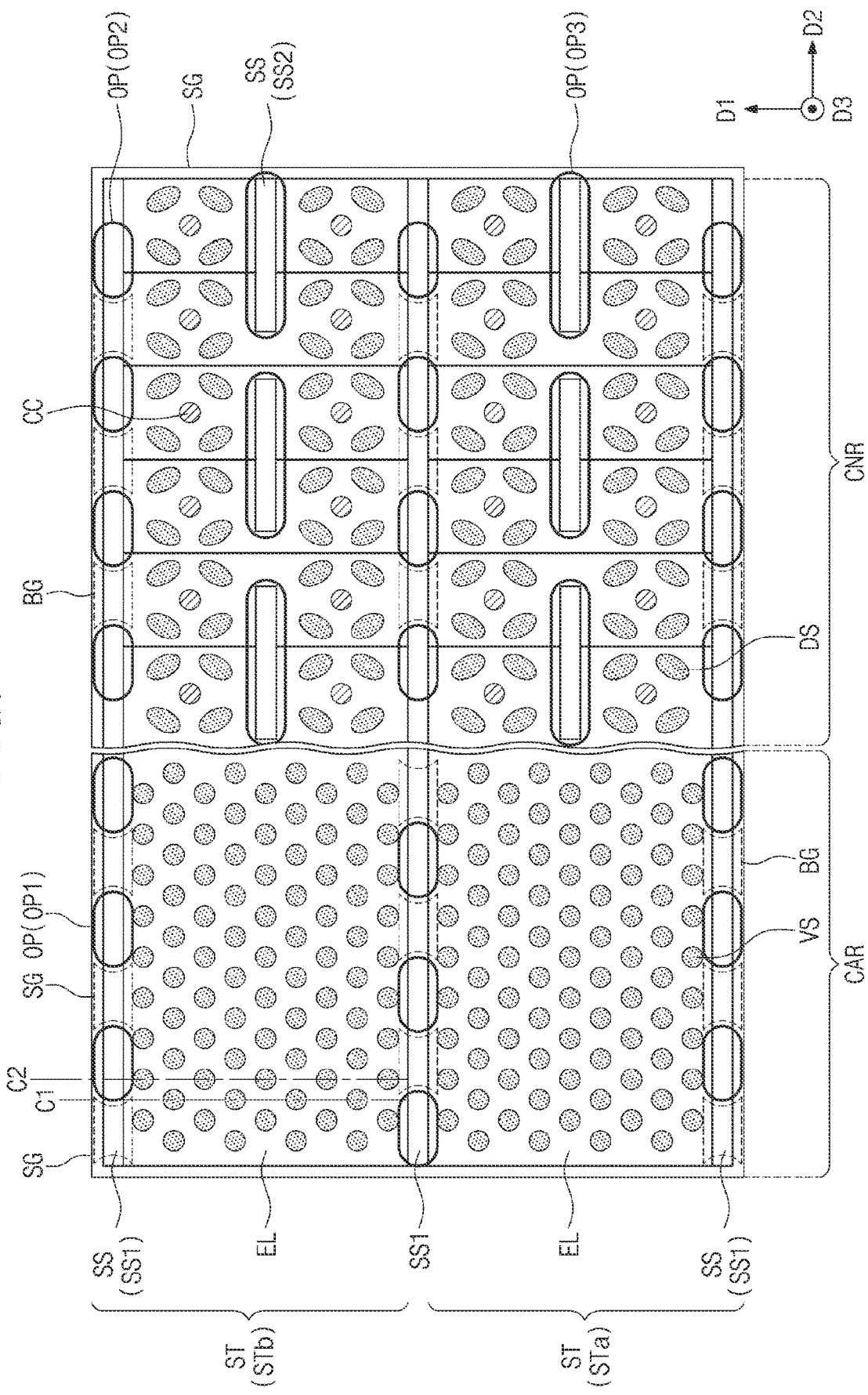
FIG. 21 is a plan view illustrating a semiconductor device according to an embodiment of the inventive concept.

FIG. 21 is a plan view illustrating a semiconductor device according to an embodiment of the inventive concept. The description that follows will mainly refer to features that are different from those in the embodiment of FIG. 5, for the sake of brevity.

Referring to FIG. 21, the second opening OP2 may be disposed in the connection region CNR and on each of the first separation structures SS1. In the semiconductor device according to the present embodiment, a plurality of second openings OP2 may be disposed on each of the first separation structures SS1 in the connection region CNR, unlike that in FIG. 5. Each of the second openings OP2 may have substantially the same shape and size as each of the first openings OP1, but the inventive concept is not limited to this example. Due to this arrangement, shape and size of the second openings OP2, the bridge portions BG of the supporting structure SG may be provided between the second openings OP2, which are adjacent to each other in the second direction D2.

As shown in FIG. 21, the third openings OP3 on the second separation structures SS2 may have the same shape as that in the embodiment of FIG. 5, but the inventive concept is not limited to this example. For example, the third openings OP3 may have the same shape and size as the first openings OP1.

Figure 22:
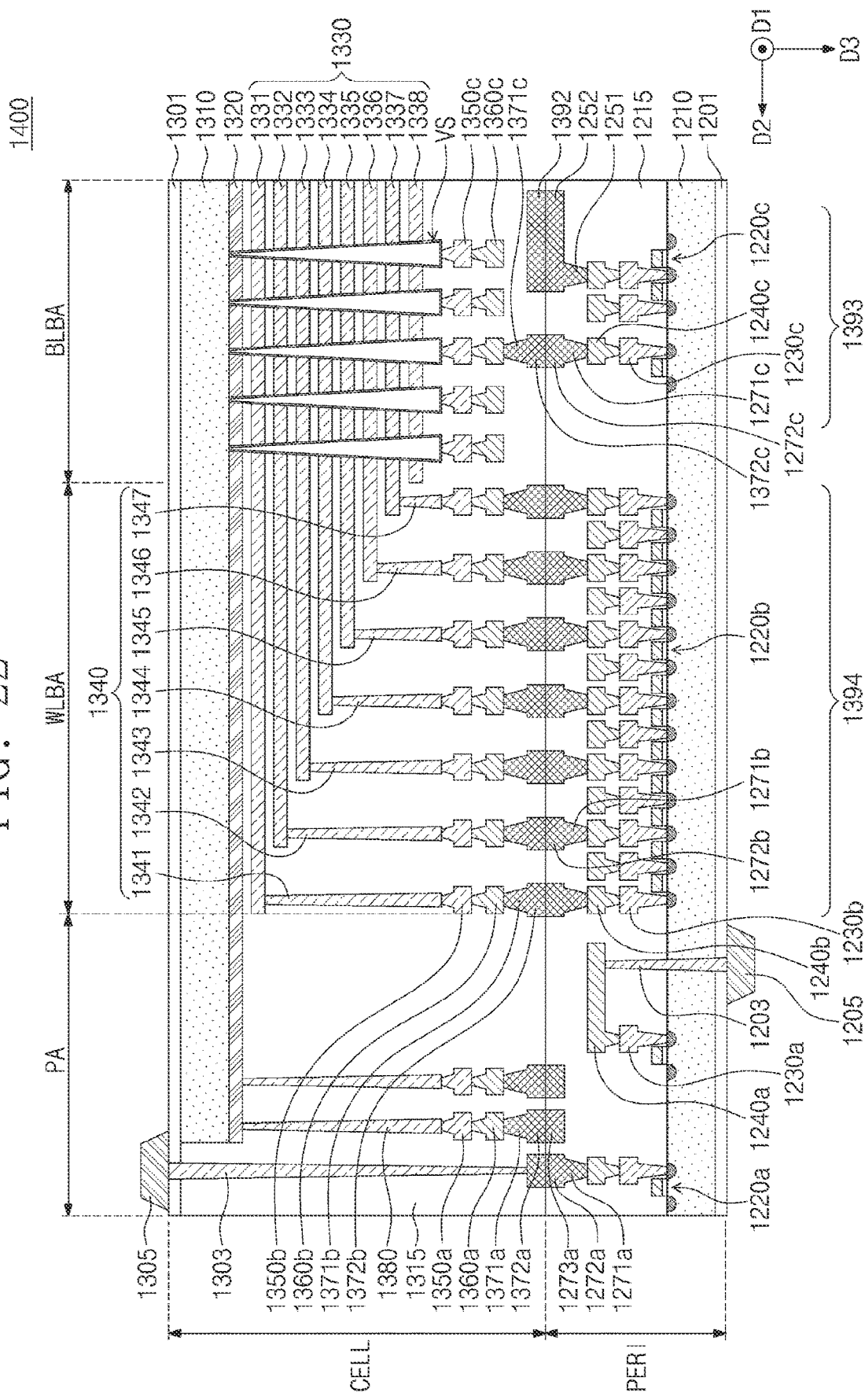
FIG. 22 is a sectional view illustrating a semiconductor device according to an embodiment of the inventive concept.

FIG. 22 is a sectional view illustrating a semiconductor device according to an embodiment of the inventive concept.

Referring to FIG. 22, a memory device 1400 may have a chip-to-chip (C2C) structure. In the C2C structure, an upper chip including a cell array structure CELL may be fabricated on a first wafer, a lower chip including a peripheral circuit structure PERI may be fabricated on a second wafer that is different from the first wafer, and the upper chip and the lower chip may be connected to each other in a bonding method. In an embodiment, the bonding method may mean a method of electrically connecting a bonding metal, which is provided as the uppermost metal layer of the upper chip, to a bonding metal, which is provided as the uppermost metal layer of the lower chip. For example, in the case where the bonding metals are formed of copper (Cu), the bonding method may be a Cu-to-Cu bonding method, but in an embodiment, the bonding metals may be formed of aluminum (Al) or tungsten (W).

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220a, 1220b, and 1220c formed on the first substrate 1210, first metal layers 1230a, 1230b, and 1230c connected to the circuit devices 1220a, 1220b, and 1220c, respectively, and second metal layers 1240a, 1240b, and 1240c formed on the first metal layers 1230a, 1230b, and 1230c. In an embodiment, the first metal layers 1230a, 1230b, and 1230c may be formed of a material (e.g., tungsten) having a relatively high electrical resistivity, and the second metal layers 1240a, 1240b, and 1240c may be formed of a material (e.g., copper) having a relatively low electrical resistivity.

Although only the first metal layers 1230a, 1230b, and 1230c and the second metal layers 1240a, 1240b, and 1240c are illustrated and described in the present specification, the inventive concept is not limited thereto and at least one metal layer may be further formed on the second metal layers 1240a, 1240b, and 1240c. At least one of the additional metal layers, which are formed on the second metal layers 1240a, 1240b, and 1240c, may be formed of or include a low resistive material (e.g., aluminum) whose electrical resistivity is lower than the material (e.g., copper) of the second metal layers 1240a, 1240b, and 1240c.

The interlayer insulating layer 1215 may be disposed on the first substrate 1210 to cover the circuit devices 1220a, 1220b, and 1220c, the first metal layers 1230a, 1230b, and 1230c, and the second metal layers 1240a, 1240b, and 1240c and may be formed of or include at least one of various insulating materials (e.g., silicon oxide or silicon nitride).

Lower bonding metals 1271a and 1272a may be formed in the outer pad bonding region PA. Lower bonding metals 1271b and 1272b may be formed on the second metal layer 1240b and in the word line bonding region WLBA. The word line bonding region WLBA may correspond to the connection region CNR described with reference to FIG. 5. In the word line bonding region WLBA, the lower bonding metals 1271b and 1272b of the peripheral circuit structure PERI may be electrically connected to upper bonding metals 1371b and 1372b of the cell array structure CELL in a bonding manner, and the lower bonding metals 1271b and 1272b and the upper bonding metals 1371b and 1372b may be formed of or include at least one of aluminum, copper, tungsten, or the like.

The cell array structure CELL may provide at least one memory block. The cell array structure CELL may include a second substrate 1310 and a common source line 1320. A plurality of electrodes 1331-1338 (1330) may be stacked on the second substrate 1310 in a direction that is perpendicular to a top surface of the second substrate 1310. In the bit line bonding region BLBA, the channel structure CH may be extended in the direction perpendicular to the top surface of the second substrate 1310 to penetrate the electrodes 1330. The vertical structure VS may include a data storage layer, a channel layer, an insulating gapfill layer, or the like, and in this case, the channel layer may be electrically connected to a first metal layer 1350c and a second metal layer 1360c. In an embodiment, the first metal layer 1350c may serve as a bit line contact, and the second metal layer 1360c may serve as a bit line.

A region, in which the vertical structure VS and the bit line 1360c are disposed, may be defined as the bit line bonding region BLBA and may correspond to the cell array region CAR described with reference to FIG. 5. In the peripheral circuit structure PERI adjacent to the bit line bonding region BLBA, the bit line 1360c may be electrically connected to the circuit devices 1220c constituting a page buffer 1393. As an example, the bit line 1360c may be connected to the peripheral circuit structure PERI through upper bonding metals 1371c and 1372c, and the upper bonding metals 1371c and 1372c may be connected to lower bonding metals 1271c and 1272c, which are connected to the circuit devices 1220c of the page buffer 1393.

In the word line bonding region WLBA, the electrodes 1330 may be extended in the second direction D2, which is parallel to the top surface of the second substrate 1310, and may be connected to a plurality of cell contact plugs 1341-1347 (1340). The electrodes 1330 and the cell contact plugs 1340 may be connected to each other through pads, which are provided as portions of the electrodes 1330 extended in the second direction D2 and have different lengths in the second direction D2. A first metal layer 1350b and a second metal layer 1360b may be sequentially connected to upper portions of the cell contact plugs 1340, which are connected to the electrodes 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

The cell contact plugs 1340 may be electrically connected to the circuit devices 1220b constituting a row decoder 1394 of the peripheral circuit structure PERI. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

A common source line contact plug 1380 may be disposed in the outer pad bonding region PA. The common source line contact plug 1380 may be formed of or include at least one of various conductive materials (e.g., metals, metal compounds, or polysilicon) and may be electrically connected to the common source line 1320. A first metal layer 1350a and a second metal layer 1360a may be sequentially stacked on the common source line contact plug 1380. As an example, a region, in which the common source line contact plug 1380, the first metal layer 1350a, and the second metal layer 1360a are provided, may be defined as the outer pad bonding region PA.

Input/output pads 1205 and 1305 may be disposed in the outer pad bonding region PA. A lower insulating layer 1201 may be formed below the first substrate 1210 on (e.g., to cover) a bottom surface of the first substrate 1210, and a first input/output pad 1205 may be formed on the lower insulating layer 1201. The first input/output pad 1205 may be connected to at least one of circuit devices 1220*a*, 1220*b*, and 1220*c*, which are provided in the peripheral circuit structure PERI, through a first input/output contact plug 1203, and may be spaced apart from the first substrate 1210 by the lower insulating layer 1201. In addition, a sidewall insulating layer may be disposed between the first input/output contact plug 1203 and the first substrate 1210 to electrically separate the first input/output contact plug 1203 from the first substrate 1210.

An upper insulating layer 1301 may be formed on the second substrate 1310 on (e.g., to cover) the top surface of the second substrate 1310, and a second input/output pad 1305 may be disposed on the upper insulating layer 1301. The second input/output pad 1305 may be connected to at least one of the circuit devices 1220*a*, 1220*b*, and 1220*c*, which are provided in the peripheral circuit structure PERI, through a second input/output contact plug 1303. In an embodiment, the second input/output pad 1305 may be electrically connected to the circuit device 1220*a*.

In an embodiment, the second substrate 1310 and the common source line 1320 may not be disposed in a region provided with the second input/output contact plug 1303. Also, the second input/output pad 1305 may not be overlapped with the electrodes 1330 in the third direction D3. The second input/output contact plug 1303 may be spaced apart from the second substrate 1310 in a direction, which is parallel to the top surface of the second substrate 1310, and may be provided to penetrate an interlayer insulating layer 1315 of the cell array structure CELL and to be connected to the second input/output pad 1305.

In an embodiment, the first input/output pad 1205 and the second input/output pad 1305 may be selectively formed. As an example, the memory device 1400 may include only the first input/output pad 1205, which is disposed on the first substrate 1210, or the second input/output pad 1305, which is disposed on the second substrate 1310. Alternatively, the memory device 1400 may include both of the first and second input/output pads 1205 and 1305.

The memory device 1400 may include an upper metal pattern 1372*a* and a lower metal pattern 1273*a*, which are provided in the outer pad bonding region PA, and here, the lower metal pattern 1273*a* may be formed in the uppermost metal layer of the peripheral circuit structure PERI to correspond to the upper metal pattern 1372*a*, which is formed in the uppermost metal layer of the cell array structure CELL, or to have the same shape as the upper metal pattern 1372*a* of the cell array structure CELL. The lower metal pattern 1273*a*, which is provided in the uppermost metal layer of the peripheral circuit structure PERI, may not be connected to any contact, in the peripheral circuit structure PERI. Similarly, in the outer pad bonding region PA, the upper metal pattern 1372*a* may be formed in the uppermost metal layer of the cell array structure CELL to correspond to the lower metal pattern 1273*a*, which is provided in the uppermost metal layer of the peripheral circuit structure PERI, and to have the same shape as the lower metal pattern 1273*a* of the peripheral circuit structure PERI.

The lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to the upper bonding metals 1371*b* and 1372*b* of the cell array structure CELL in a bonding manner.

In the bit line bonding region BLBA, a lower metal patterns 1251, 1252 may be formed in the uppermost metal layer of the peripheral circuit structure PERI, and an upper metal pattern 1392 may be formed in the uppermost metal layer of the cell array structure CELL to have the same shape as the lower metal pattern 1252 of the peripheral circuit structure PERI. Any contact may not be formed on the upper metal pattern 1392, which is formed in the uppermost metal layer of the cell array structure CELL.

According to an embodiment of the inventive concept, mold structures, which are divided by trenches, may be connected to each other by bridge portions and may support each other, and thus, it may be possible to prevent or suppress a collapsing issue or a structural instability issue of a stacking structure from occurring before a gate-electrode-forming step in a fabrication process of a semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
   gate stacks on a substrate and spaced apart from each other in a first direction parallel to an upper surface of the substrate, the gate stacks comprising electrodes and cell insulating layers that are alternately stacked, the substrate comprising a cell array region and a connection region adjacent to the cell array region in a second direction parallel to the upper surface of the substrate and crossing the first direction;
   a separation structure between the gate stacks and extending in the second direction;
   vertical structures penetrating the gate stacks and having vertical semiconductor patterns extending in a third direction perpendicular to the upper surface of the substrate and conductive pads directly connected to upper surfaces of the vertical semiconductor patterns;
   a supporting structure on the gate stacks, the supporting structure extending from the cell array region into the connection region;
   bit lines on the supporting structure; and
   contact plugs penetrating the supporting structure and electrically connecting the bit lines to the vertical structures, the contact plugs directly connected to upper surfaces of the conductive pads,
   wherein a bottom surface of a portion of the supporting structure on an upper surface of the separation structure is lower than top surfaces of the conductive pads.

2. The semiconductor device of claim 1,
   wherein the bottom surface of the portion of the supporting structure on the separation structure is on a top surface of the separation structure and is higher than bottom surfaces of the conductive pads, and
   wherein a top surface of the portion of the supporting structure on the separation structure is higher than the top surfaces of the conductive pads.

3. The semiconductor device of claim 1, wherein a thickness of the supporting structure is about 4 to about 6 times a thickness of the conductive pads.

4. The semiconductor device of claim 1, wherein the supporting structure comprises a material whose hardness is greater than the cell insulating layers of the gate stacks.

5. The semiconductor device of claim 1,
   wherein the supporting structure comprises a plurality of openings along the separation structure, and wherein the separation structure extends into the openings.

6. The semiconductor device of claim 5,
wherein the separation structure comprises:
first portions that extend into the openings; and
second portions that are between the openings,
wherein top surfaces of the second portions are lower than the top surfaces of the conductive pads, and
wherein top surfaces of the first portions are higher than the top surfaces of the conductive pads.

7. The semiconductor device of claim 6, further comprising an interface insulating layer between the vertical structures and the electrodes,
wherein the interface insulating layer extends to a region on the second portions of the separation structure, and
wherein the interface insulating layer is in contact with the bottom surface of the portion of the supporting structure on the separation structure.

8. The semiconductor device of claim 5,
wherein the separation structure comprises a first separation structure and a second separation structure that are adjacent to each other in the first direction,
wherein the openings comprise first openings on the first separation structure and second openings on the second separation structure, and
wherein the second openings are shifted from the first openings in the second direction.

9. The semiconductor device of claim 5,
wherein the substrate comprises a cell array region and a connection region,
wherein the supporting structure is on the cell array region and the connection region, and
wherein the openings are on the cell array region and the connection region.

10. The semiconductor device of claim 9, wherein first ones of the openings on the connection region are longer in the second direction than second ones of the openings on the cell array region.

11. The semiconductor device of claim 9,
wherein the separation structure comprises:
a first separation structure that extends from the cell array region to the connection region; and
second separation structures that are offset from the first separation structure in the first direction,
wherein the second separation structures penetrate the gate stacks and are spaced apart from each other in the second direction, in the connection region, and
wherein the openings on the connection region overlap the second separation structures.

12. The semiconductor device of claim 5,
wherein the portion of the supporting structure on the separation structure comprises a first bridge portion among a plurality of bridge portions that are on the separation structure and between the openings, and
wherein the plurality of bridge portions are between the gate stacks.

13. The semiconductor device of claim 1, wherein the bottom surface of the portion of the supporting structure on the separation structure is lower than bottom surfaces of the contact plugs.

14. The semiconductor device of claim 1,
wherein the supporting structure comprises a first supporting layer and a second supporting layer on the first supporting layer,
wherein a top surface of the first supporting layer is substantially coplanar with the top surfaces of the conductive pads, and wherein a top surface of the second supporting layer is substantially coplanar with top surfaces of the contact plugs.

15. A semiconductor device comprising:
a peripheral circuit structure; and
a cell array structure on the peripheral circuit structure,
wherein the cell array structure comprises:
a lower semiconductor layer and a source semiconductor layer on the lower semiconductor layer;
gate stacks on the source semiconductor layer and spaced apart from each other in a first direction parallel to an upper surface of the substrate, the gate stacks including electrodes and cell insulating layers, alternately stacked in a third direction perpendicular to the upper surface of the substrate;
a separation structure between the gate stacks and extending in a second direction parallel to the upper surface of the substrate and crossing the first direction;
vertical structures that penetrate the gate stacks in the third direction and are electrically connected to the source semiconductor layer, the vertical structures having conductive pads on upper portions thereof;
an interface insulating layer between the vertical structures and the electrodes;
a supporting structure on the gate stacks;
bit lines on the supporting structure; and
contact plugs penetrating the supporting structure and electrically connecting the bit lines to the vertical structures,
wherein the supporting structure comprises a plurality of openings arranged in the second direction along the separation structure, the plurality of openings at least partially overlapping portions of the separation structure when viewed in a plan view,
wherein the separation structure comprises first portions that extend into the openings and second portions that are between the openings, and
wherein a top surface of a portion of the interface insulating layer that extends into a region between the second portions of the separation structure and the supporting structure is lower than top surfaces of the conductive pads.

16. The semiconductor device of claim 15,
wherein the supporting structure further comprises bridge portions that are on the separation structure and between the openings, and
wherein the bridge portions are between the gate stacks.

17. The semiconductor device of claim 15, wherein a bottom surface of the supporting structure is higher than bottom surfaces of the conductive pads.

18. The semiconductor device of claim 15, wherein top surfaces of the first portions are higher than the top surfaces of the conductive pads.

19. An electronic system comprising:
a main substrate;
a semiconductor device on the main substrate, and
a controller on the main substrate and electrically connected to the semiconductor device,
wherein the semiconductor device comprises:
gate stacks that are spaced apart from each other in a first direction parallel to an upper surface of the main substrate, the gate stacks comprising electrodes and cell insulating layers that are alternately stacked in a third direction perpendicular to the upper surface of the main substrate;

a separation structure between the gate stacks and extending in a second direction parallel to the upper surface of the main substrate and crossing the first direction;
vertical structures penetrating the gate stacks and having vertical semiconductor patterns extending in the third direction and conductive pads directly connected to upper surfaces of the vertical semiconductor patterns;
a supporting structure on the gate stacks;
bit lines on the supporting structure;
contact plugs penetrating the supporting structure and electrically connecting the bit lines to the vertical structures, the contact plugs directly connected to upper surfaces of the conductive pads;
a peripheral circuit electrically connected to the bit lines; and
an input/output pad electrically connected to the peripheral circuit,
wherein a bottom surface of a portion of the supporting structure on an upper surface of the separation structure is lower than top surfaces of the conductive pads and is higher than bottom surfaces of the conductive pads, with respect to the upper surface of the main substrate.

20. The electronic system of claim 19,
wherein the main substrate further comprises interconnection patterns electrically connecting the semiconductor device to the controller,
wherein the supporting structure comprises a plurality of openings along the separation structure,
wherein the separation structure comprises first portions that extend into the openings and second portions that are between the openings,
wherein the semiconductor device further comprises an interface insulating layer between the vertical structures and the electrodes, and
wherein a top surface of a portion of the interface insulating layer that extends into a region between the second portions of the separation structure and the supporting structure is lower than the top surfaces of the conductive pads.

* * * * *